(12) United States Patent
Iguchi

(10) Patent No.: US 10,763,249 B2
(45) Date of Patent: Sep. 1, 2020

(54) IMAGE DISPLAY DEVICE

(71) Applicant: SHARP KABUSHIKI KAISHA, Sakai, Osaka (JP)

(72) Inventor: Katsuji Iguchi, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/426,270

(22) Filed: May 30, 2019

(65) Prior Publication Data

US 2019/0371777 A1 Dec. 5, 2019

Related U.S. Application Data

(60) Provisional application No. 62/678,533, filed on May 31, 2018.

(51) Int. Cl.
*H01L 25/18* (2006.01)
*H01L 23/00* (2006.01)
*H01L 33/62* (2010.01)
*H01L 27/15* (2006.01)
*H01L 27/12* (2006.01)
(Continued)

(52) U.S. Cl.
CPC .............. *H01L 25/18* (2013.01); *H01L 24/29* (2013.01); *H01L 24/32* (2013.01); *H01L 24/83* (2013.01);
(Continued)

(58) Field of Classification Search
CPC ..... H01L 25/18; H01L 33/0093; H01L 24/29; H01L 24/32; H01L 24/83; H01L 33/62; H01L 27/156; H01L 27/1214; H01L 2224/29264; H01L 2224/29244; H01L 2224/29269; H01L 2224/29255; H01L 2224/29224; H01L 2224/32145; H01L 2224/83851; H01L 2924/12041; H01L 2924/12042; H01L 2924/1426; H01L 2933/0066; H01L 33/38; H01L 2224/83005; H01L 33/46; H01L 33/32; H01L 33/42; H01L 2933/0016; H01L 2933/0025; H01L 27/124; H01L 33/382;
(Continued)

(56) References Cited

U.S. PATENT DOCUMENTS

2011/0035925 A1 2/2011 Marion
2017/0273192 A1* 9/2017 Sato ..................... C09D 11/14

FOREIGN PATENT DOCUMENTS

JP 2002-141492 A 5/2002

* cited by examiner

*Primary Examiner* — Karen Kusumakar
(74) *Attorney, Agent, or Firm* — ScienBiziP, P.C.

(57) ABSTRACT

Provided is an image display device including a micro light emission element that is connected onto a drive circuit substrate incorporating a drive circuit of the micro light emission element. The micro light emission elements has a light emission surface on an opposite side to a bonding surface with the drive circuit, at least one of a surface on a connecting surface side of the micro light emission element and a surface on a connecting surface side of the drive circuit substrate has a protrusion portion and a recess portion, an electrode of the micro light emission element and an electrode of the drive circuit substrate side are connected to each other via a metal nanoparticle, and a space formed between the surface on the connecting surface side of the micro light emission element and a side of the surface on the connecting surface side of the drive circuit substrate is filled with a photo-curing resin.

19 Claims, 14 Drawing Sheets

(51) Int. Cl.
*H01L 33/00* (2010.01)
*H01S 5/02* (2006.01)
*H01L 33/38* (2010.01)
*H01L 33/46* (2010.01)
*H01L 33/32* (2010.01)
*H01L 33/42* (2010.01)
*H01S 5/42* (2006.01)
*H01S 5/022* (2006.01)

(52) U.S. Cl.
CPC ........ *H01L 27/1214* (2013.01); *H01L 27/156* (2013.01); *H01L 33/0093* (2020.05); *H01L 33/62* (2013.01); *H01L 33/32* (2013.01); *H01L 33/38* (2013.01); *H01L 33/42* (2013.01); *H01L 33/46* (2013.01); *H01L 2224/29224* (2013.01); *H01L 2224/29244* (2013.01); *H01L 2224/29255* (2013.01); *H01L 2224/29264* (2013.01); *H01L 2224/29269* (2013.01); *H01L 2224/32145* (2013.01); *H01L 2224/83005* (2013.01); *H01L 2224/83851* (2013.01); *H01L 2924/12041* (2013.01); *H01L 2924/12042* (2013.01); *H01L 2924/1426* (2013.01); *H01L 2933/0016* (2013.01); *H01L 2933/0025* (2013.01); *H01L 2933/0066* (2013.01); *H01S 5/0217* (2013.01); *H01S 5/0226* (2013.01); *H01S 5/423* (2013.01)

(58) Field of Classification Search
CPC ..... H01L 25/167; H01S 5/0217; H01S 5/423; H01S 5/0226; H01S 5/02276; H01S 5/042; H01S 5/32341; H01S 5/04253; H01S 5/04257; H01S 5/026; G09G 3/32
See application file for complete search history.

FIG. 4A
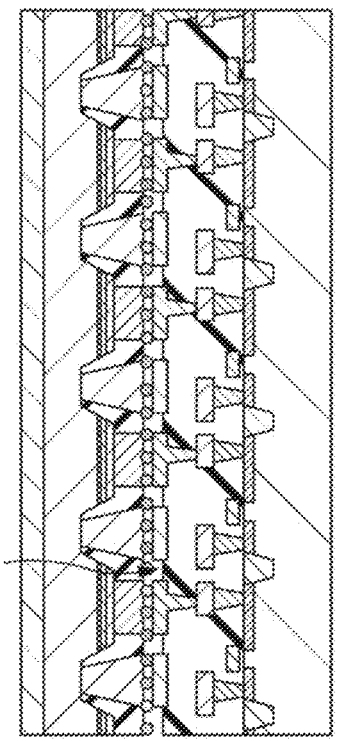
FIG. 4B
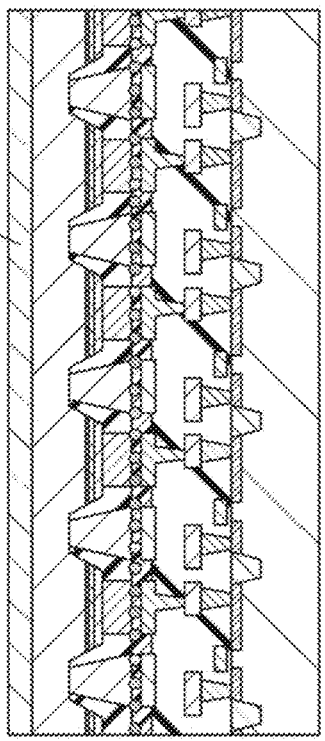
FIG. 4D
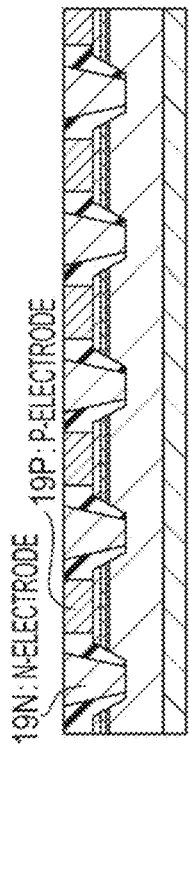
FIG. 4C
FIG. 4E
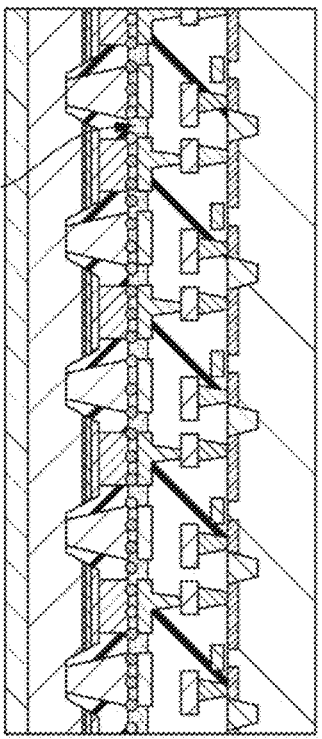
FIG. 4F
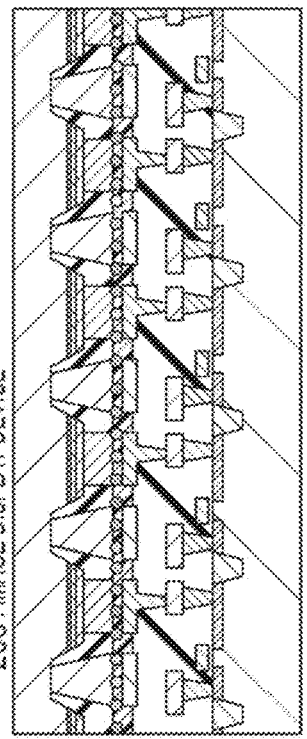
FIG. 4G

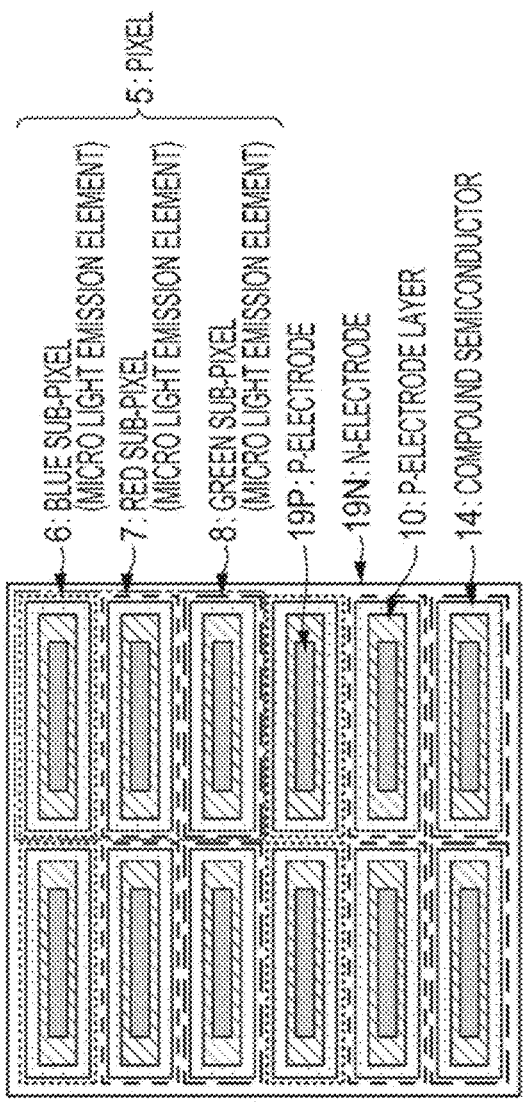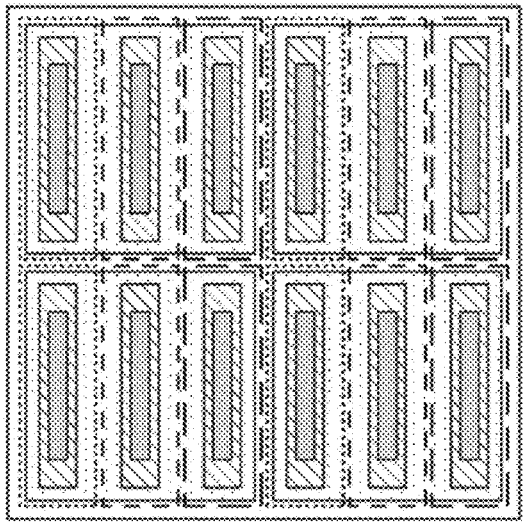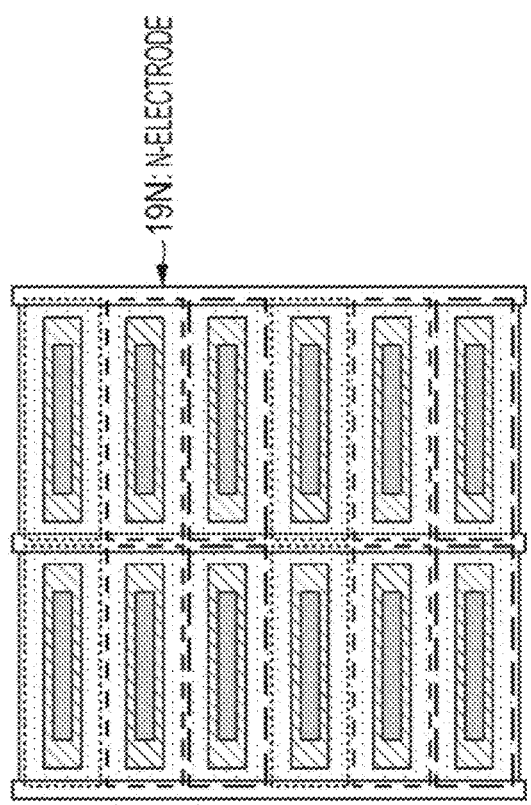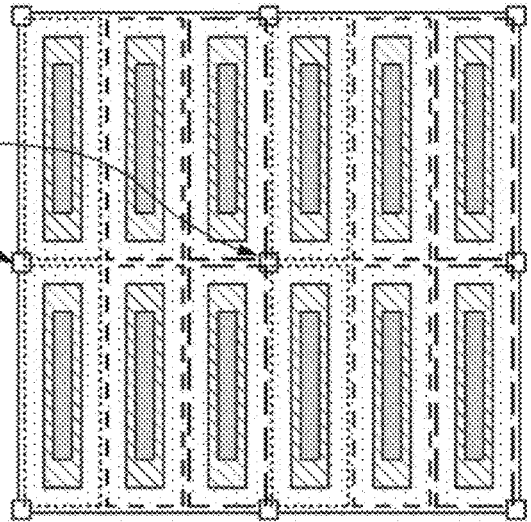

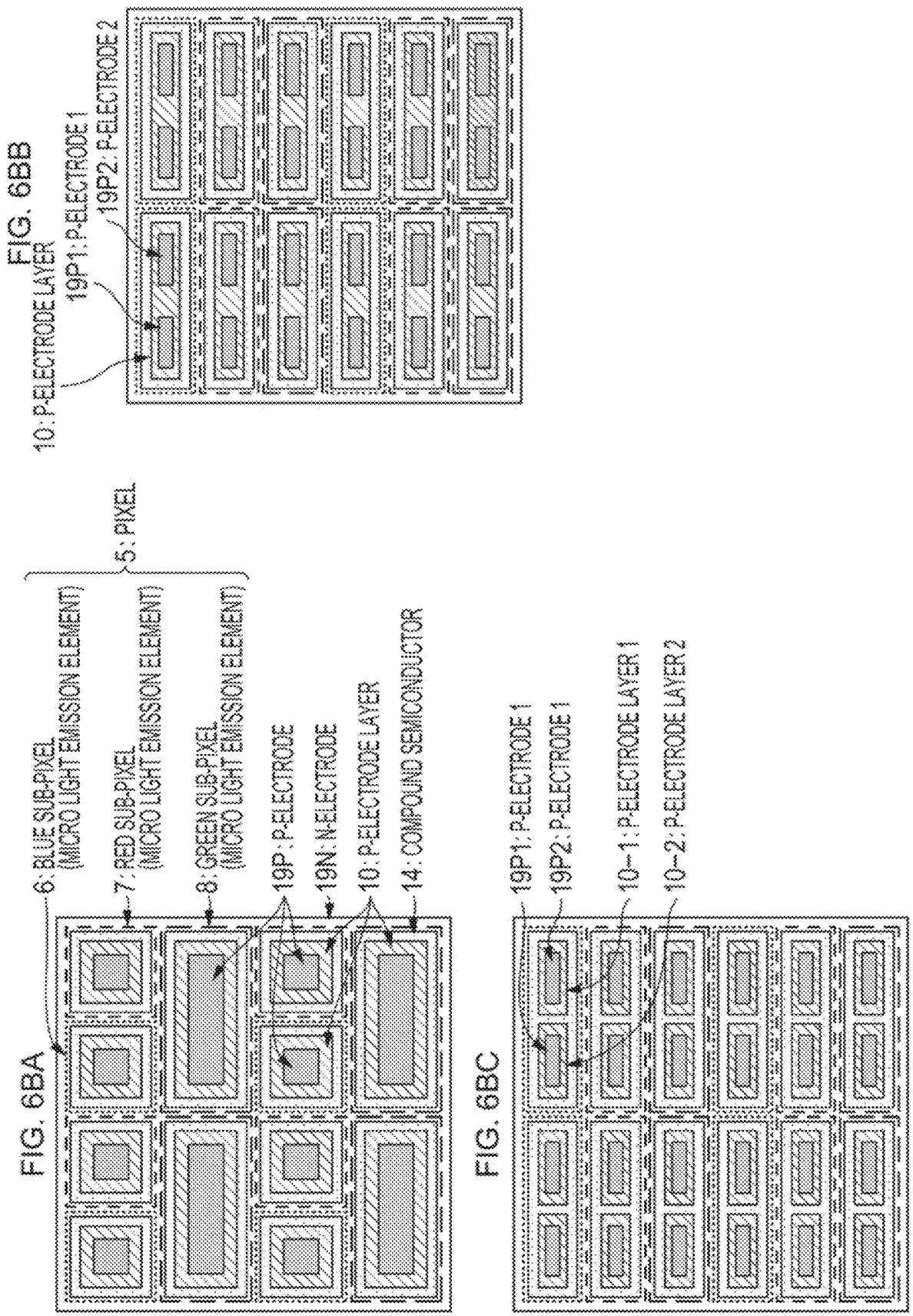

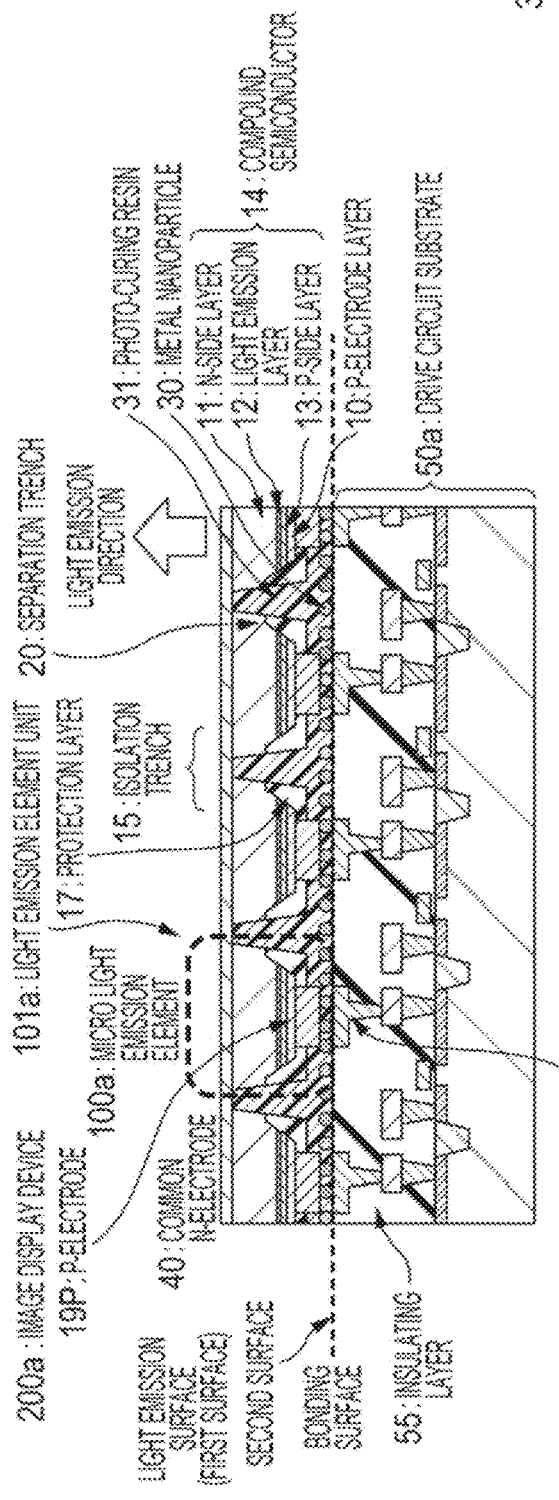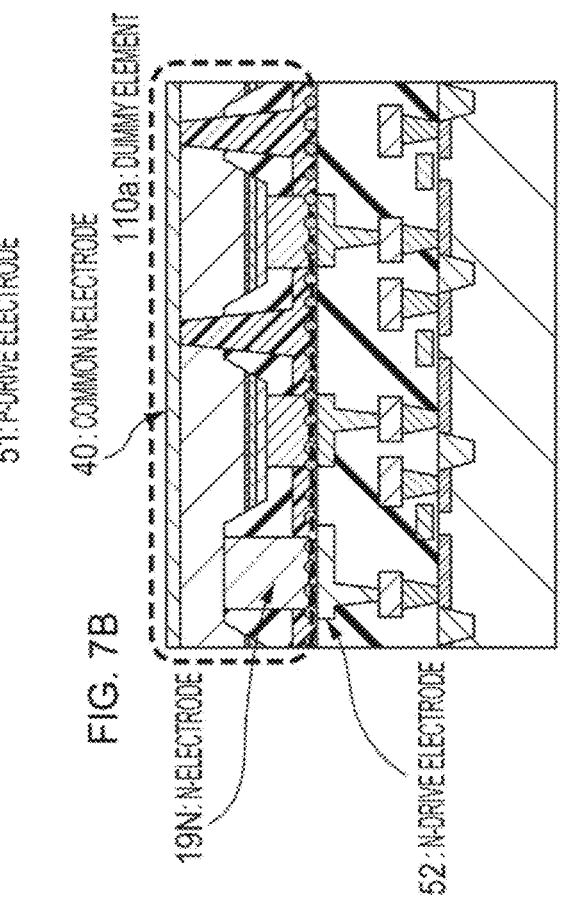

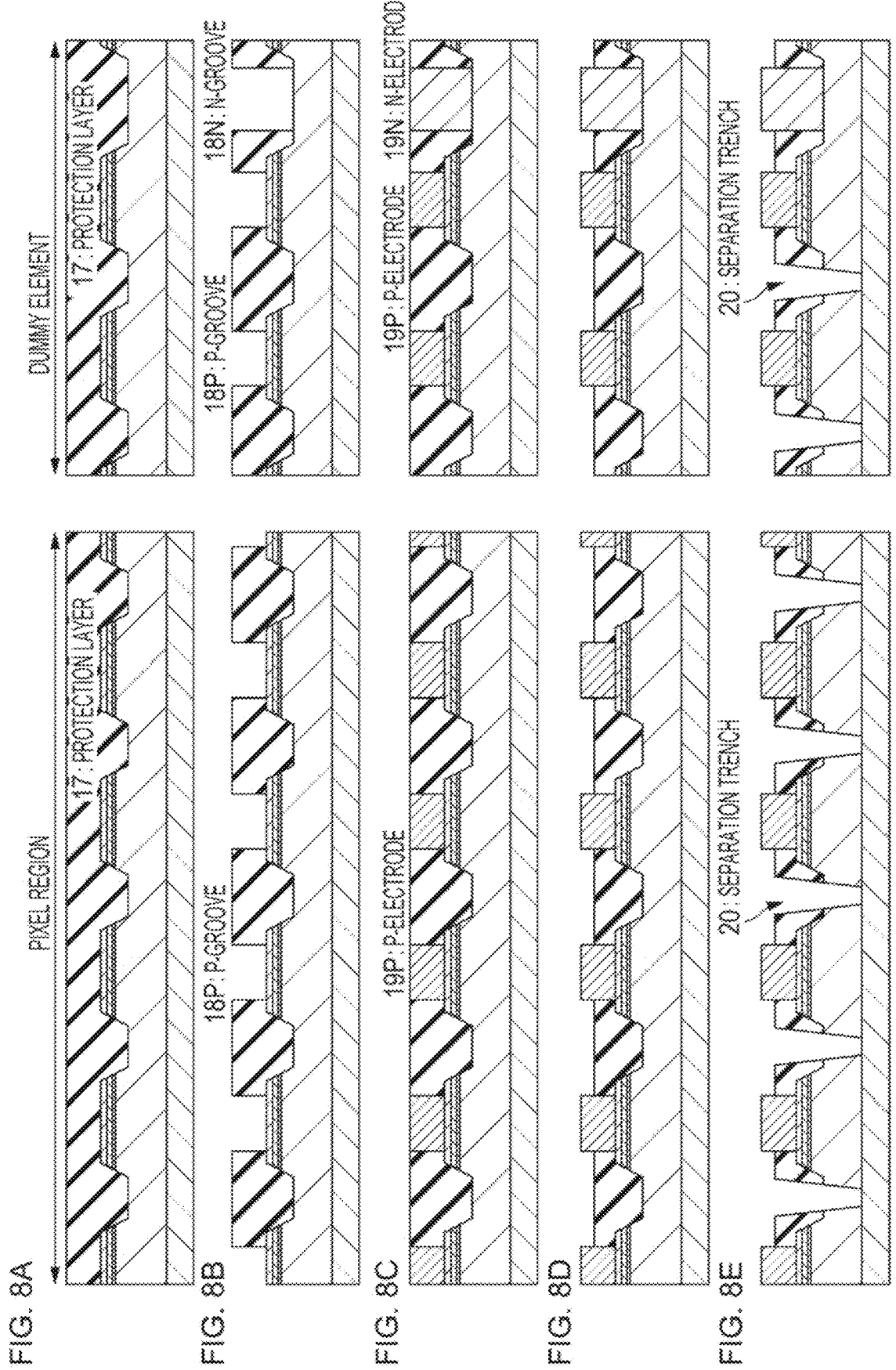

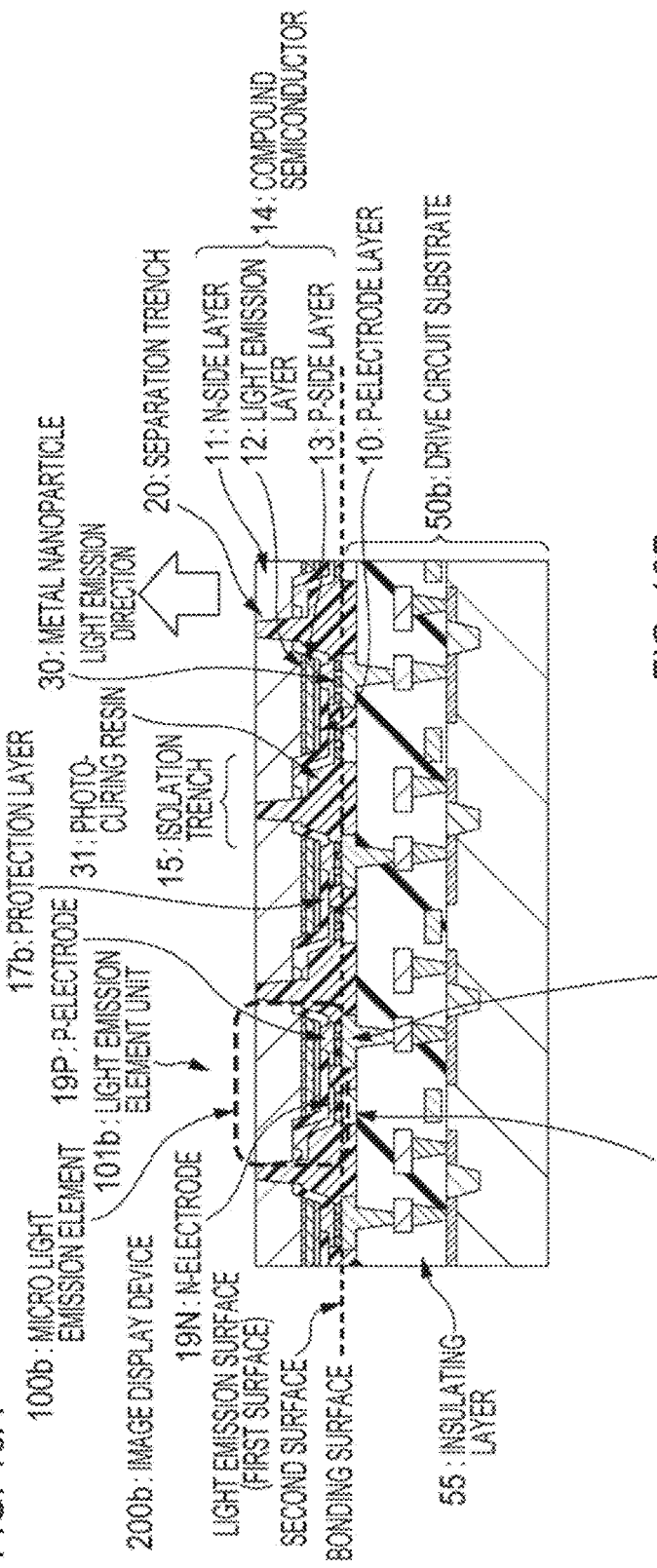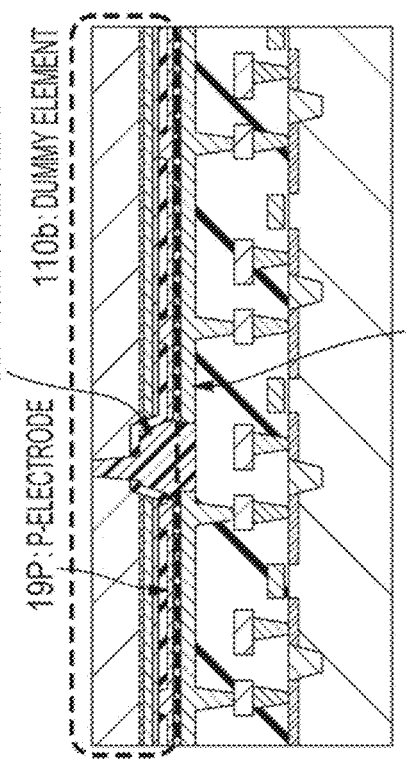
FIG. 10A
FIG. 10B

32: FLATTENING LAYER

30: METAL NANOPARTICLE

200a: IMAGE DISPLAY DEVICE

33: SPACE

31: PHOTO-CURING RESIN

9: GROWTH SUBSTRATE
52: N-DRIVE ELECTRODE  51: P-DRIVE ELECTRODE

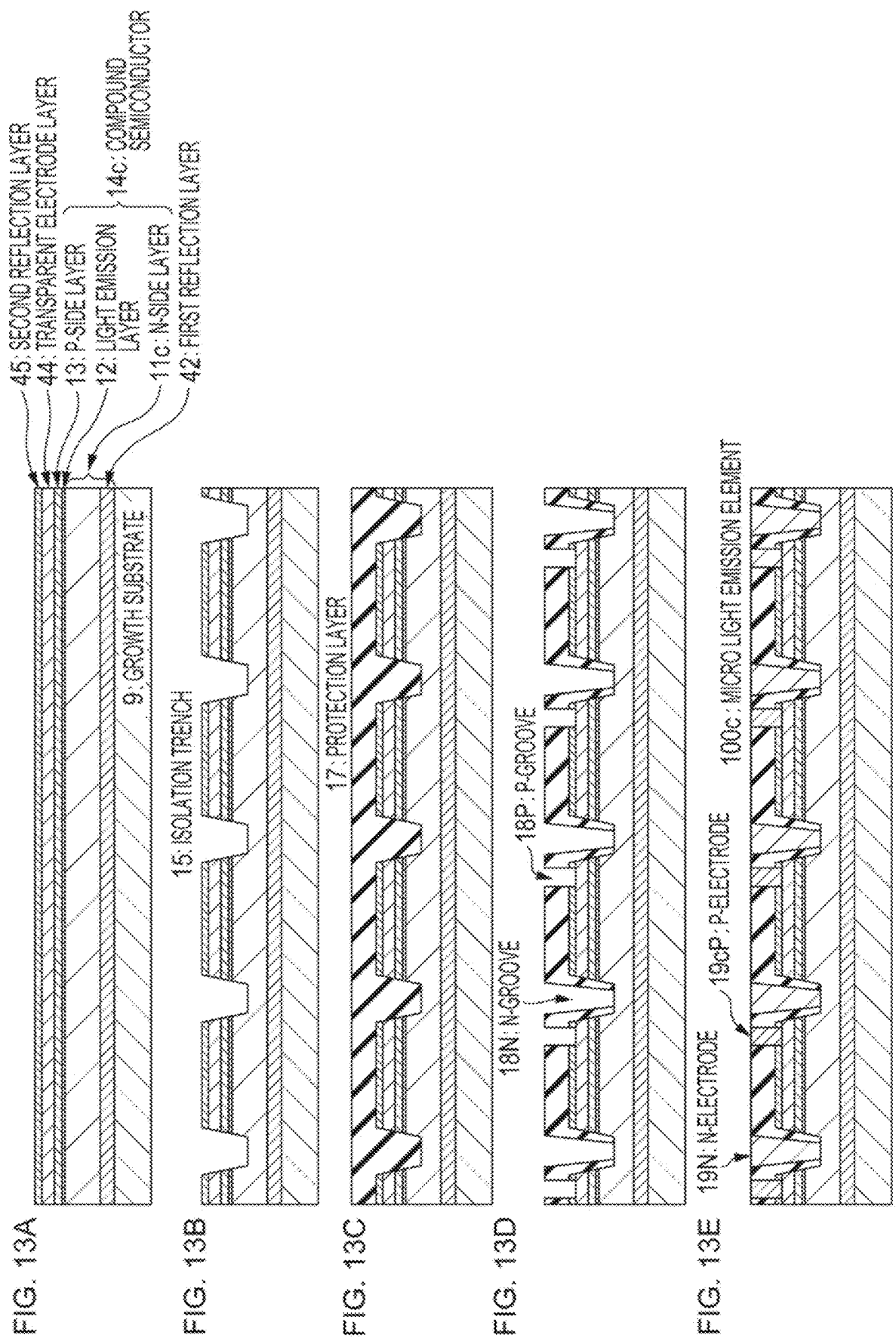

IMAGE DISPLAY DEVICE

BACKGROUND

1. Field

The present disclosure relates to an image display device.

2. Description of the Related Art

A display device which is provided with a plurality of micro light emission elements constituting a pixel on a drive circuit substrate has been proposed. As such a display device, for example, a small-sized display device for displaying a color image is disclosed in Japanese Unexamined Patent Application Publication No. 2002-141492. In the display device, a drive circuit is formed on a silicon substrate and a minute ultraviolet light emitting diode (LED) array is disposed on the drive circuit. In the display device, a wavelength conversion layer which converts ultraviolet ray into red, green, and blue visible lights is provided on an ultraviolet light emitting diode.

Such a display device has characteristics of small size, high luminance, and high durability. Therefore, it is expected to serve as a display device for a display apparatus such as a glasses-type device or head up display (HUD).

In addition, in such a display device, since materials constituting the drive circuit substrate and the micro light emission element are different, a process of bonding both the drive circuit substrate and the micro light emission element is desired. (See Japanese Unexamined Patent Application Publication No. 2002-141492 and United States Patent Application Publication No. 2011/0035925).

In a process of bonding a micro LED onto a large-scale integrated circuit (LSI) in which the drive circuit is formed to manufacture a minute projection display apparatus, it is desirable to bond a micro LED group which is a light emission element unit onto a wafer on which a drive circuit LSI is formed, and to electrically connect electrodes of the individual micro LEDs to electrodes of the drive circuit in one-to-one manner. The size of one micro LED is about 50 μm to several μm and the number of the micro LEDs is tens of thousands to millions. Accordingly, the size of one electrode is about 1 μm to 10 μm, which is very small. In addition, in the silicon substrate constituting a general drive circuit, a GaN layer which constitutes the micro LED and a sapphire substrate which is a growth substrate have different thermal expansion coefficients, when a temperature rises in the bonding process, design positions of the electrodes on the drive circuit LSI and the electrodes of the micro LED are deviated depending on difference in the thermal expansion coefficient and this leads to a situation that the small electrodes do not overlap with each other. Even if the electrodes are connected to each other by disposing patterns so as to overlap each other in a heated state, when the temperature returns to room temperature, the large thermal stress occurs to break the connection.

In order to avoid such a problem, a method of connecting electrodes without temperature rise has been proposed in United States Patent Application Publication No. 2011/0035925, but a special cylindrical electrode structure for connection has to be provided, and it is not easy to apply the method to a minute electrode. In addition, the large stress has to be applied for the connection, and when the display device has high resolution and the number of electrodes for connecting increases, it is desirable to apply a very large pressure. For this reason, it is not easy to apply the method disclosed in United States Patent Application. Publication. No. 2011/0035925 to the display device with high resolution.

It is desirable to provide a method of appropriately bonding electrodes, while suppressing the rise in temperature in bonding in which the number of bonding electrodes is large and the size of the electrode is small.

SUMMARY (1) According to an embodiment of the present disclosure, there is provided an image display device comprising a plurality of micro light emission elements that are connected onto a drive circuit substrate incorporating a drive circuit of the micro light emission element, in which the micro light emission element has a light emitting surface on an opposite side to a bonding surface with the drive circuit, at least one of a surface on a connecting surface of the micro light emission element and a surface on a connecting surface side of the drive circuit substrate has a protrusion portion and a recess portion, an electrode of the micro light emission element and an electrode on a side of the drive circuit substrate are connected to each other via a metal nanoparticle, and a space formed between the surface on the connecting surface side of the micro light emission element and the surface on the connecting surface side of the drive circuit substrate is filled with a photo-curing resin.

BRIEF DESCRIPTION OF THE DRAWINGS

FIGS. 4A to 4G are views showing a manufacturing step of the image display device according to the first embodiment of the present disclosure;

FIGS. 6AA to 6AD are top views of the micro light emission element according to a modification example of the first embodiment of the present disclosure;

FIGS. 6BA to 6BC are top views of the micro light emission element according to the modification example of the first embodiment of the present disclosure;

FIGS. 7A to 7C are sectional views of an image display device according to a second embodiment of the present disclosure;

FIGS. 8A to 8E are views showing a manufacturing step of a micro light emission element according to the second embodiment of the present disclosure;

FIGS. 10A and 10B are sectional views of an image display device according to a third embodiment of the present disclosure;

FIGS. 13A to 13E are views showing a manufacturing step of a micro light emission element according to a fourth embodiment of the present disclosure.

DESCRIPTION OF THE EMBODIMENTS

First Embodiment 1

One embodiment of the present disclosure will be described below.

Outline of Structure of Image Display Device

Figure 5B:
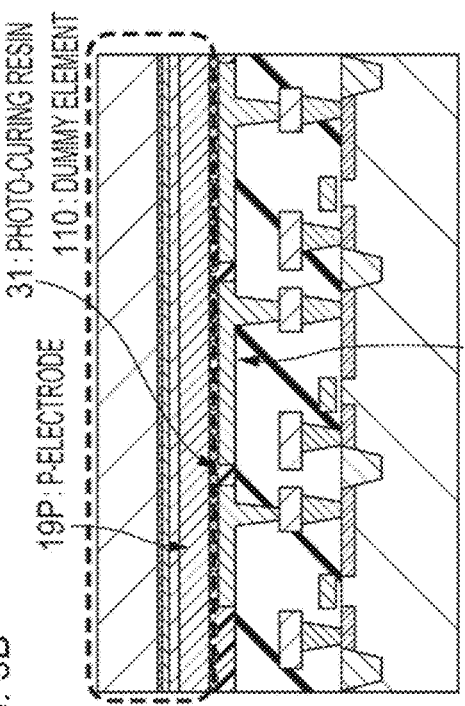
FIG. 5A is a top view of the image display device according to the first embodiment of the present disclosure and FIGS. 5B and 5C are sectional views of an outer peripheral portion of the image display device according to the first embodiment of the present disclosure.
Figure 5C:
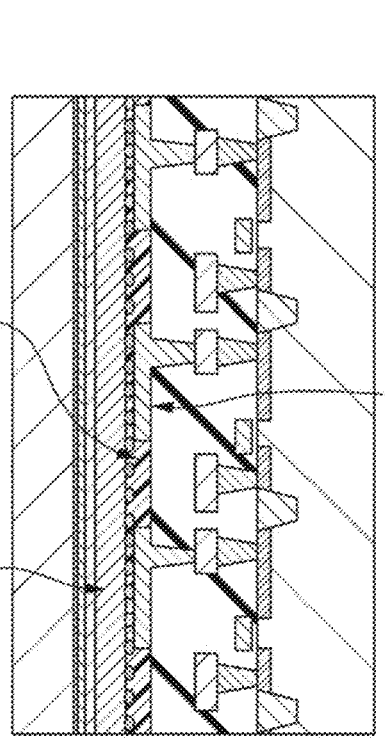
Figure 5A:
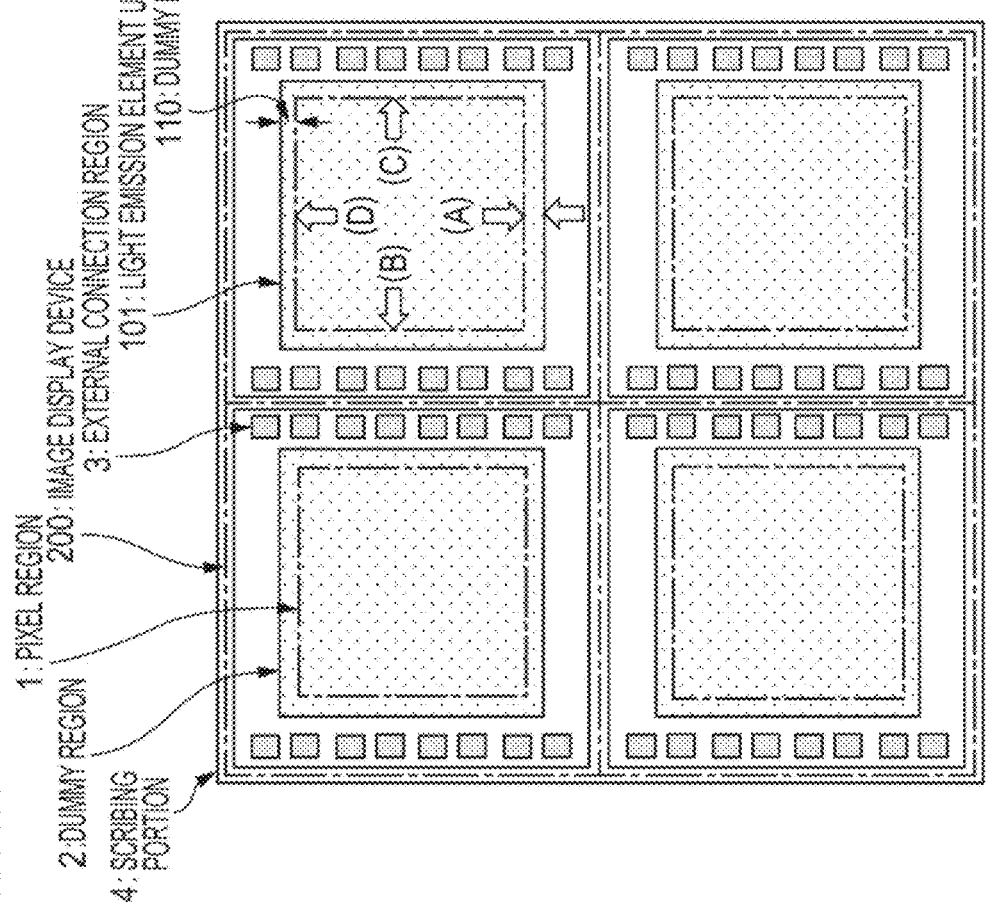

Hereinafter, embodiments of the present disclosure will be described with reference to the drawings (FIG. 1, and the like) by exemplifying an image display device 200 on which a plurality of micro light emission elements 100 are mounted as a light source. The image display device 200 has the plurality micro light emission elements 100 in a pixel region 1 (FIG. 5A). In addition, the image display device 200 includes a drive circuit substrate 50 for supplying a current to the micro light emission element 100 and emitting light. Light emitted from the micro light emission element 100 is emitted to an opposite side to the drive circuit substrate 50. In the following, a case in which a single crystal silicon is adopted as a material of the drive circuit substrate 50 is described, but a glass substrate or a plastic substrate forming a polycrystal silicon TFT or an IGZO-TFT may be also adopted as the material of the drive circuit substrate 50.

A wavelength conversion layer, a light diffusion layer, a color filter, a microlens, and the like may be disposed on a light emission side of the micro light emission element 100, but the present disclosure is not directly related thereto, such that it is not described in the drawings.

The drive circuit substrate 50 is constituted by a micro light element drive circuit, a row selection circuit, a column signal output circuit, an image processing circuit, an input/output circuit, and the like. The micro light element drive circuit controls the current supplied to each micro light emission element 100. In addition, the row selection circuit selects each row of the micro light emission element 100 arranged in a two-dimensional matrix form. In addition, the column signal output circuit outputs a light emission signal to each column of the micro light emission element 100. In addition, the image processing circuit calculates a light emission signal based on an input signal.

A P-drive electrode 51 (second drive electrode) and an N-drive electrode 52 (first drive electrode) in order to connect to the micro light emission element 100 are disposed on a surface of a bonding surface side of the drive circuit substrate 50.

In general, the drive circuit substrate 50 is a silicon substrate (semiconductor substrate) on which a large-scale integrated circuit (LSI) is formed, and since it can be manufactured by a known technique, functions and configurations of the techniques are not described in detail.

A section along a substrate surface of the micro light emission element 100 can have various planar shapes such as rectangular, polygonal, circular, and elliptical. The maximum length in a direction along a substrate surface is assumed to be 60 μm or less.

In addition, the image display device 200 is assumed that 3,000 or more micro light emission elements 100 are integrated into a pixel region 1.

The micro light emission element 100 includes a compound semiconductor 14 as a light emission portion, and generally, an N-side layer 11 (first conductive layer), a light emission layer 12, and a P-side layer 13 (second conductive layer) are each laminated in this order.

The compound semiconductor 14, for example, a micro LED element which emits light in a wavelength band from ultraviolet ray to the green light, is a nitride semiconductor (AlInGaN-based). The compound semiconductor 14 is an AlInGaP-based in a case of emitting light in a wavelength band from yellowish green color to red color. Furthermore, the compound semiconductor 14 is an AlGaAs-based or a GaAs-based in a wavelength band from red color to infrared color.

Hereinbelow, a configuration, in which the N-side layer 11 is disposed on the light emission side, regarding the compound semiconductor 14 constituting the micro light emission element 100 will be entirely described. However, the compound semiconductor 14 can have a configuration in which the P-side layer 13 is disposed on the light emission side.

Although each of the N-side layer 11, the light emission layer 12, and the P-side layer 13 is generally optimized to include a plurality of layers rather than a single layer, but it is not directly related to the present disclosure, the detailed structure of each layer is not described. In general, the light emission layer is interposed between an N-type layer and a P-type layer, but there is also a case in which the N-type layer and the P-type layer include a non-doped layer or, in some cases, a layer having a dopant with opposite conductivity, and thus, the N-type layer and the P-type layer are described as an N-side layer and a P-side layer in the following.

Details of Image Display Device 200

Figure 1:
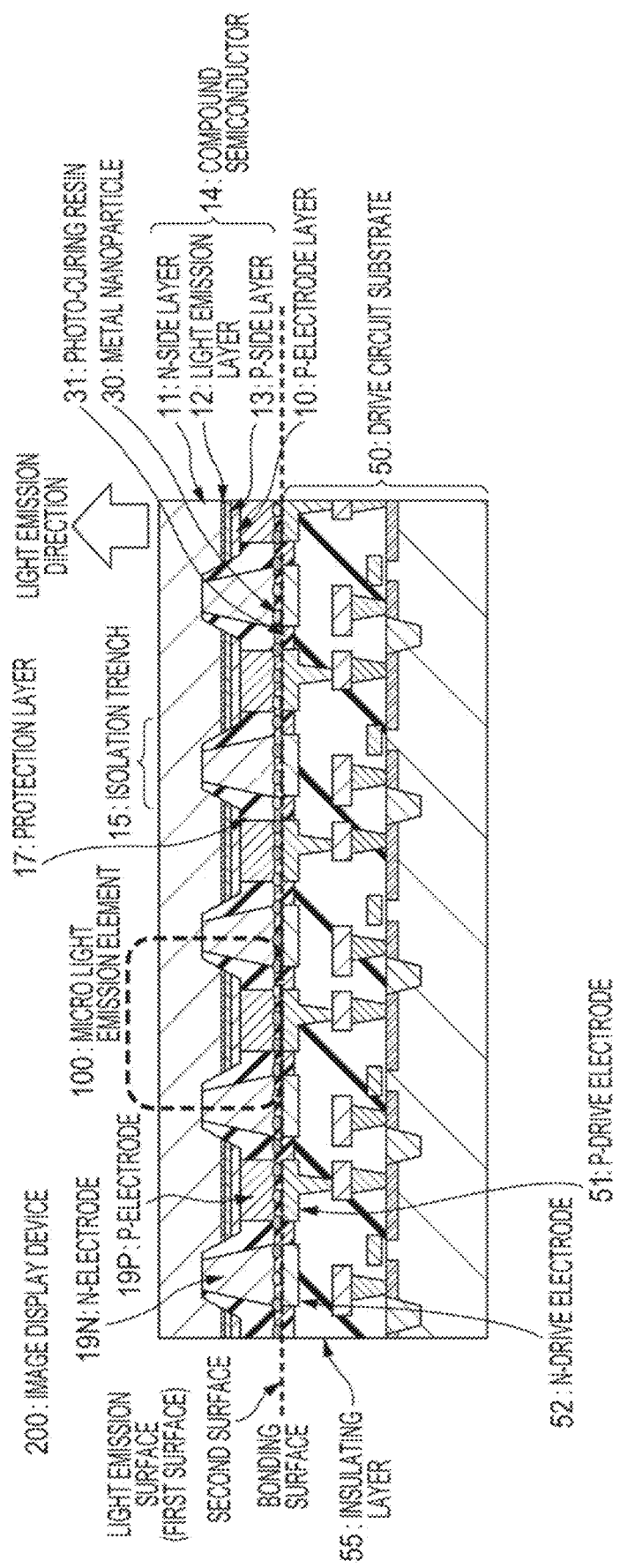
FIG. 1 is a sectional view of a pixel portion of an image display device according to a first embodiment of the present disclosure.

As shown in. FIG. 1, the image display device 200 has a configuration in which the micro light emission element 100 which emits light is bonded at the bonding surface (indicated by thick broken line) on the drive circuit substrate 50. The micro light emission element 100 has the light emission layer 12 isolated by an isolation trench 15. In the pixel region 1, a P-electrode 19P (second electrode) connected to the P-side layer 13 is disposed in the region in which the light emission layer 12 remains. In addition, in the pixel region 1, an N-electrode 19N (first electrode) connected to the N-side layer 11 is disposed in the region (isolation region) of the isolation trench 15.

Since the P-electrode 19P and the N-electrode 19N are simultaneously formed by the same step as described later, although shapes, sizes, and thicknesses are different from each other, but as a material, the P-electrode 19P and the N-electrode 19N are constituted by wiring materials having the same structure. Generally, the wiring material has a laminated structure formed of a plurality of layers such as a barrier metal layer, a main conductive layer, and a cap layer, but the P-electrode 19P and the N-electrode 19N have the same laminated structure. That is, the image display device 200 is constituted by a single wiring layer on the micro light emission element 100b side.

In the configuration of the present embodiment, since the P-electrode 19P and the N-electrode 19N are constituted by a metal material ohmic-connected to the N-side layer 11, the ohmic connection to the P-side layer 13 is performed via a P-electrode layer 10. In a case where the compound semiconductor 14 is a nitride semiconductor, the P-electrode layer 10 is a good conductor, for example, an indium-tin-oxide (ITO), which is a transparent electrode, palladium (Pd), or the like.

The isolation trench 15 of the micro light emission element 100 is buried with a protection layer 17 and a surface (second surface) on the bonding surface side of the protection layer 17 is flat. The P-electrode 19P and the N-electrode 19N are formed on the bonding surface side, and the surfaces are configured in a flat surface having almost the same height as that of the surface of the protection layer 17.

In addition, the surface of the P-drive electrode 51 and the surface of N-drive electrode 52 on the drive circuit substrate 50 side are configured to be higher than a surface of an insulating layer 55. That is, the P-drive electrode 51 and the N-drive electrode 52 are protrusion portions on the surface of the drive circuit substrate 50 and portions of the insulating layer 55 not covered by the electrodes are recess portions. The P-electrode 19P and the N-electrode 19N are respectively connected to the P-drive electrode 51 and the N-drive electrode 52 on the drive circuit substrate 50 side.

Nanometer-sized metal nanoparticles 30 are arranged at a boundary surface between the P-electrode 19P and the P-drive electrode 51 and a boundary surface between the N-electrode 19N and the N-drive electrode 52. A space portion between the drive circuit substrate 50 and the micro light emission element 100 is filled with a photo-curing resin 31. Since the P-electrode 19P and the P-drive electrode 51, or the N-electrode 19N and the N-drive electrode 52 are in contact with each other via a number of metal nanoparticles 30 and the drive circuit substrate 50 and the micro light emission element 100 are firmly in close contact with each other due to a shrinkage of the photo-curing resin 31, excellent electrical connection can be realized. A material of the metal nanoparticles 30 is palladium (Pd), gold (Au), platinum (Pt), nickel (Ni), aluminum (Al), or the like. The photo-curing resin 31 is a resin which causes a polymerization reaction to be cured by irradiation of ultraviolet rays or near-ultraviolet rays, may be an acrylate radical polymerization type resin such as an epoxy-based resin, a urethane-based resin, an acrylic based-resin, and a silicone-based resin, and may be a cationic polymerization type resin such as an epoxy-based resin.

As such, the P-electrode 19P and the P-drive electrode 51, or the N-electrode 19N and the N-drive electrode 52 are electrically connected to each other by the metal nanoparticles 30, such that surface layers of the P-electrode 19P and the N-electrode 19N and surface layers of the P-drive electrode 51 and the N-drive electrode 52 may be different materials.

Outline of Micro Light Emission Element 100

Figure 2A:
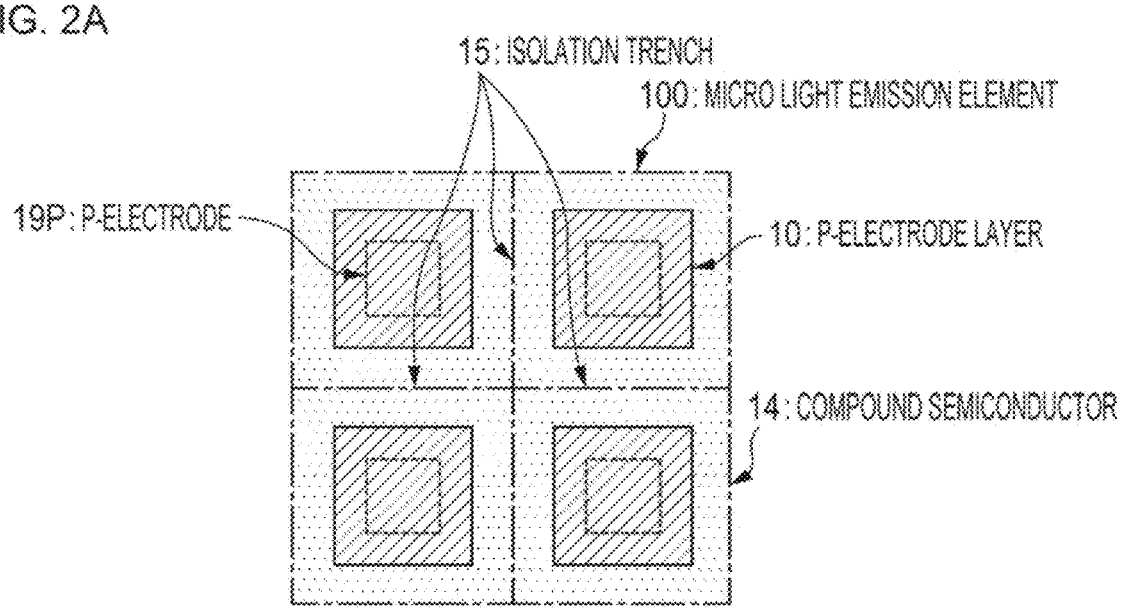
FIGS. 2A and 2B are top views of a micro light emission element according to the first embodiment of the present disclosure.
Figure 2B:
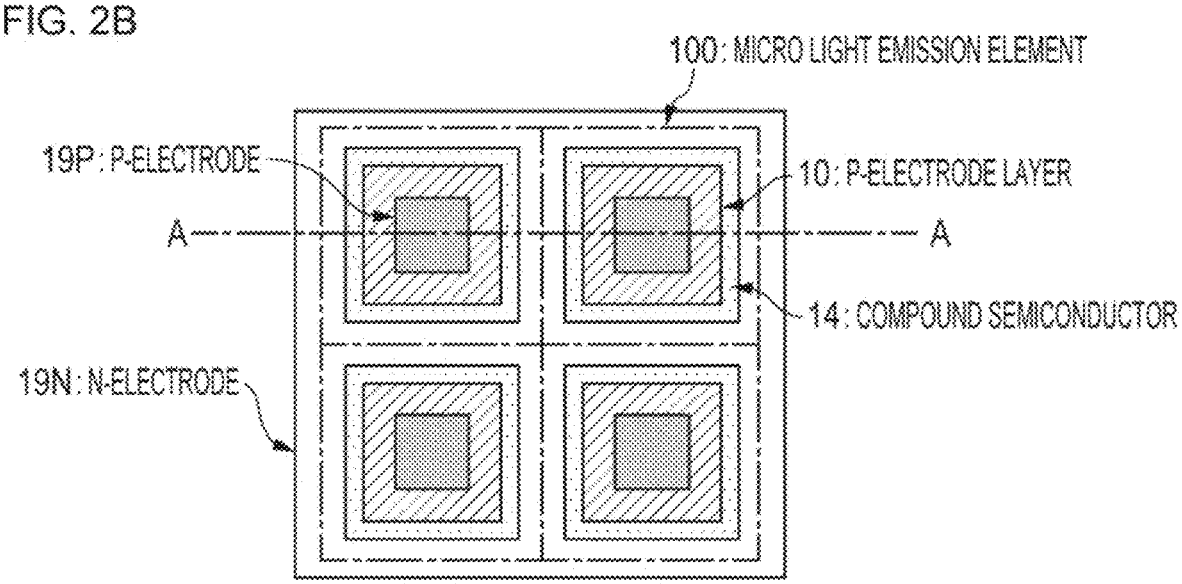

As viewed from the bonding surface side, in general, the micro light emission elements 100 are arranged in a two-dimensional array. As shown in FIG. 2B, the P-electrode 19P is disposed in the center portion of the micro light emission element 100 and the N-electrode 19N is disposed at an isolation region of a boundary. The isolation trench 15 is present at a lower portion of the N-electrode 19N as shown in FIG. 2A. FIG. 1 shows an I-I cross section in FIG. 2B. In addition, FIG. 2A show a surface after forming the isolation trench 15 (state of FIG. 3B). Furthermore, FIG. 2B shows a surface after forming the P-electrode 19P and the N-electrode 19N (state of FIG. 3E). However, the protection layer 17 is omitted.

Manufacturing Method of Micro Light Emission Element 100

Figures 3A, 3B, 3C, 3D, 3E:
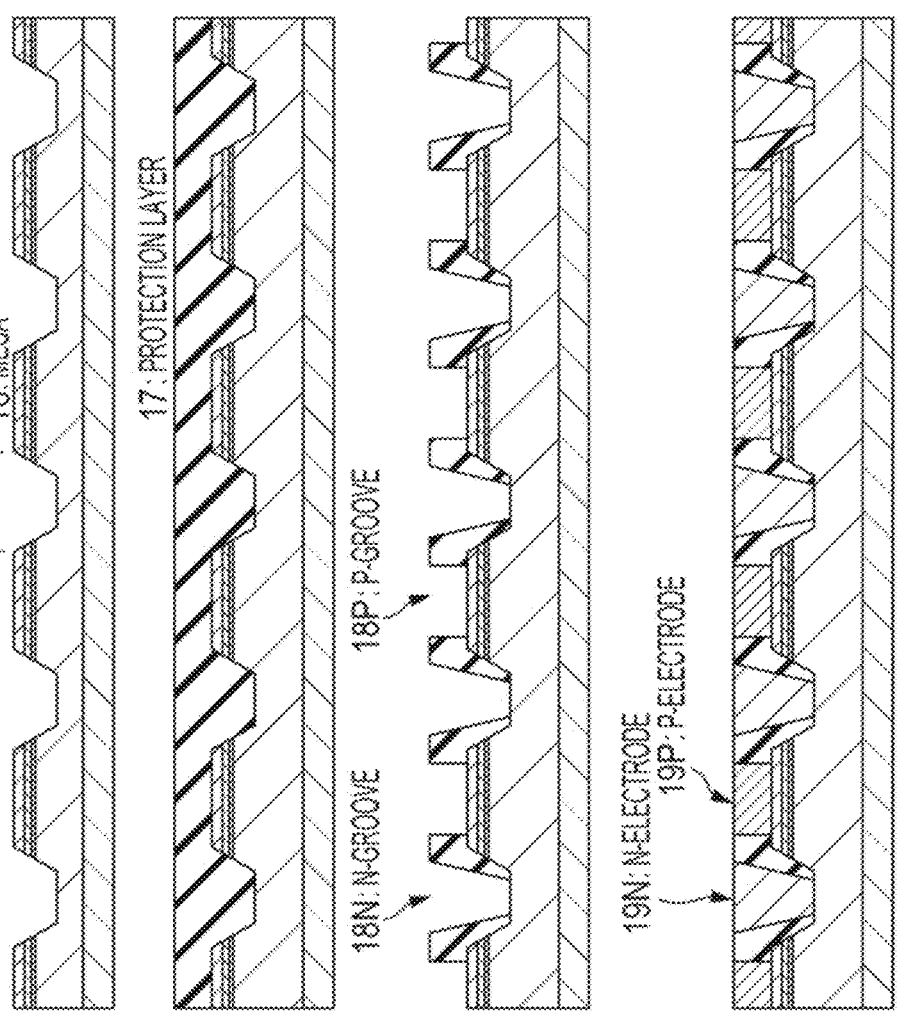
FIGS. 3A to 3E are views showing a manufacturing step of the micro light emission element according to the first embodiment of the present disclosure.

Next, a manufacturing step of the micro light emission element 100 is described with reference to FIGS. 3A to 3E. As shown in FIG. 3A, the compound semiconductor 14 formed of the N-side layer 11, the light emission layer 12, and the P-side layer 13 is sequentially laminated on a growth substrate 9, and the P-electrode layer 10 is deposited on the compound semiconductor. The growth substrate 9 is, for example, a sapphire substrate. The growth substrate 9 is desirably a substrate transparent to ultraviolet ray or near-ultraviolet ray.

Next, as shown in FIG. 3B, portions of the P-electrode layer 10, the P-side layer 13, the light emission layer 12, and the N-side layer 11 are etched to form the isolation trench 15. At this time, the portion including the light emission layer 12 is referred to as a mesa 16.

As shown in. FIG. 2A, the isolation trenches 15 are arranged in vertical and horizontal directions at equal intervals and the mesa 16 has a truncated square pyramid shape. However, the shape of the mesa 16 is not limited to the truncated square pyramid shape and may be a truncated cone shape or other polygonal truncated cone shapes.

It is desirable that a side wall of the mesa 16 is inclined at 45 degrees±10 degrees with respect to the surface formed by the light emission layer 12. Among light emitted from the light emission layer 12, a proportion of the light traveling in a direction parallel with the light emission layer 12 is largest. Therefore, light emitting efficiency of the micro light emission element 100 can be improved by reflecting the light to a direction of a light emission surface.

Light emitted to a horizontal direction repeats the reflection, is absorbed by vertical sidewalls and therefore does not exit to the outside freer the light emission surface in a case where the side wall of the mesa 16 is perpendicular. If the inclination of the side wall of the mesa 16 is greatly deviated from 45 degrees, an incident angle becomes too large when the light is incident on the light emission surface, which causes total reflection on the light emission surface and thus the light does not exit to the outside.

Next, as shown in FIG. 3C, the protection layer 17 is deposited to flatten by chemical-mechanical-polishing (CMP) the surface. The protection layer 17 is an insulating layer, and is, for example, $SiO_2$, SiN, or SiON, or a laminated film formed thereof. In a formation of the protection layer 17, various film formation techniques such as a chemical vapor deposition (CVD) method, a sputtering method, and a coating method can be used.

Next, as shown in. FIG. 3D, a P-groove 18P is formed on the mesa 16 and an N-groove 18N is formed on the isolation trench 15. The P-groove 18P has a hole shape and reaches the P-electrode layer 10. The N-groove 18N is a channel shape running in both the vertical and horizontal directions and reaches the N-side layer 11 of a bottom portion of the isolation trench 15.

Furthermore, as shown in FIG. 3E, the P-groove 18P and the N-groove 18N are buried with the metal film by a damascene method to form the P-electrode 19P and the N-electrode 19N. The metal film is a combination of a barrier film such as tantalum (Ta), tungsten (W), and titanium nitride (TiN) with copper. The metal film may also be a combination of gold or nickel, an aluminum alloy, or the like with the corresponding barrier film. In the damascene method, a metal thin film is deposited and CMP polishing is performed on a base structure having a groove, so that the metal thin film can remain in the groove and the surface is flattened.

Here, the damascene method is one of the metal wiring formation method of LSI, and is a thin film formation technique using a plating technique and a CMP method in combination. The damascene technique of burying a fine metal wiring layer in the insulating layer is referred to as a damascene method. Copper wiring is usually produced by using the damascene method. A groove is formed with a wiring shape in an interlayer insulating layer and metal such as copper is buried. There is two wiring methods, one is called a "single damascene wiring method", which is a method of forming a wiring groove after forming a contact plug of metal in a connection hole. The other method is called a "dual damascene wiring method", which is a method of burying the metal at once after forming the connection hole and the wiring groove. The damascene method is used in combination with a CMP technique of flattening a multilayer wiring layer. The step of FIGS. 3A to 3E is a single damascene wiring method.

By doing so, the P-electrode 19P is disposed on the mesa 16, the N-electrode 19N is disposed on an isolation trench 15, the P-electrode 19P and the N-electrode 19N are disposed together on the surface the same plane) which is to be the bonding surface, such that the surfaces thereof are configured to be made of the same materials and are leveled with the surface of the protection layer 17.

In the configuration of the embodiment, the wiring layer is formed of one layer, and can be formed by the two-stage photolithography process of forming the isolation trench 15 and the mesa 16 and forming the P-groove 18P and the N-groove 18N. Therefore, the micro light emission element 100 can be manufactured in a very simple manufacturing step, such that the capital investment can be reduced and manufacturing costs can be greatly reduced.
Manufacturing Method of Image Display Device 200

Next, a manufacturing step of the image display device 200 will be described with reference to FIG. 4. As shown in FIG. 4A, the micro light emission element 100 is formed through the steps of FIGS. 3A to 3E. Next, as shown in FIG. 4B, the metal nanoparticles 30 are arranged on the substrate of the micro light emission element 100. The metal nanoparticles 30 are, for example, palladium.

The nanoparticles of the palladium can be formed utilizing self-organization of a block copolymer. (see Japanese Patent No. 5875124). One of the methods of utilizing the self-organization of the block copolymer is a method of (i) spin-coating polystyrene-block-poly(2-vinylpyridine) which is a kind of the block copolymer on the micro light emission element 100, (ii) immersing the spin-coated film to an aqueous solution of sodium tetrachloropalladate (Na2PdCl4) and selectively precipitating the palladium ion into a 2-vinylpyridine core in polystyrene-block-poly(2-vinylpyridine), and (iii) removing polystyrene-block-poly (2-vinylpyridine) by a plasma treatment. In this method, the palladium nanoparticles having sizes of several tens of nanometers can be precipitated at an interval of about 100 nm to 300 nm.

The thickness of the block copolymer for forming such metal nanoparticles 30 are very thin, such that it is not easy t uniformly form the nanoparticles on the surface with large protrusions and recesses. Accordingly, an electrode surface on which the metal nanoparticles 30 are formed is desirable to be flat. In the present embodiment, this condition is satisfied by forming the surface of the micro light emission element 100 to be flat.

In addition, the drive circuit substrate 50 is manufactured as shown in FIG. 4C. The drive circuit substrate 50 is formed on a single crystal silicon substrate (wafer) by the ordinary complementary metal oxide semiconductor (CMOS) process. The surface of the P-drive electrode 51 and the surface of the N-drive electrode 52 on the drive circuit substrate 50 side is configured to be higher than the surface of the insulating layer 55. The wiring material constituting the P-drive electrode 51 and the N-drive electrode 52 is, for example, copper wiring or an aluminum alloy. The aluminum is processed by a dry etching technique in a case of the aluminum alloy, such that it is easy to form the structure in FIG. 4C. The copper wiring is formed by a damascene method in a case of the copper wiring, such that it requires an additional step of etching the insulating layer around copper wiring because the surface is flattened. That is, as shown in FIG. 4C, a protrusion portion of the surface on the bonding surface side of the drive circuit substrate 50 is an electrode constituting the P-drive electrode 51 or the N-drive electrode 52, and a recess portion is an exposed portion of the insulating layer 55 which is disposed between the electrodes.

Here, it is desirable that the drive circuit substrate 50 is in a wafer state and it is desirable that the micro light emission elements 100 and their growth substrate 9 in FIG. 4A is a group divided from a wafer for example, where each group corresponds to an image display device 200. The divided group of the micro light emission element 100 is referred to as a light emission element unit 101.

Next, the light emission element unit 101 is disposed on the silicon surface on which the drive circuit substrate 50 is formed as shown in FIG. 4D. At this stage, a space 33 is disposed between the surface on the bonding surface side of the drive circuit substrate 50 and the surface on the bonding surface side of the light emission element unit 101. Next, as shown in FIG. 4E, the space 33 is filled with the photo-curing resin 31 by injecting the photo-curing resin 31 into the space 33. By performing the connection for every light emission element units, the time necessary the photo-curing resin 31 to be spread all over the space can be shortened and the bonding time is also shortened. It is also possible to bond the wafers together by taking more time.

In order to widely spread the photo-curing resin 31 between the drive circuit substrate 50 and the light emission element unit 101, a space is desirable between both of them. It is not easy to spread the photo-curing resin 31 over the space defined by a height of the metal nanoparticles 30 in a short time. Since the connecting surface of the light emission element unit 101 side to which the metal nanoparticles 30 are bonded is flat, it is desirable to form protrusion portions or recess portions on the drive circuit substrate 50 side in order to form the sufficient space 33. This is the reason why the P-drive electrode 51 and the N-drive electrode 52 have a projecting shape.

Next, as shown in FIG. 4F, light is radiated from the growth substrate 9 side to cure the resin, such that the photo-curing resin 31 is cured. In a case where the growth substrate 9 does not transmit light as a silicon substrate, since photo curing is not able to be performed unless the growth substrate 9 is peeled off, it is desirable that the growth substrate 9 transmits light for photo-curing. By performing the photo curing, the drive circuit substrate 50 and the micro light emission element 100 are firmly connected to each other, and thus it is easy to perform a subsequent peeling step of the growth substrate (FIG. 4G). The peeling of the growth substrate 9 can be realized by the laser lift-off method or the like. By performing heating after peeling the growth substrate 9, the polymerization of the photo-curing resin 31 is further promoted so as to make electrical connection firmer. At this time, since the growth substrate 9 is peeled off, the thermal stress caused due to the difference in coefficient of thermal expansion is greatly released.

Even when the P-electrode 19P and the N-electrode 19N of the micro light emission element 100 are press-bonded to the P-drive electrode 51 and the N-drive electrode 52 of the drive circuit substrate 50 through the metal nanoparticles 30, respectively, the connection resistance is not able to be substantially reduced. However, the connection resistance can be reduced without raising a temperature because of large shrinkage stress, which is appeared by irradiating the photo-curing resin 31 with curing light. Accordingly, the connection for the drive circuit substrate 50 and the micro light emission element 100 which are greatly different in thermal coefficients of expansion can be performed without concerning the position deviation of the electrodes.

Effect

Next, a plan view of the image display device 200 is shown in FIG. 5A. In the image display device 200, a portion which emits light and actually displays an image is the pixel region 1. The description so far is mostly for the pixel region 1.

In addition to the pixel region 1, a dummy region 2 which does not emit light, a plurality of external connection regions 3, a scribing portion 4 which separates the image display devices 200 individually from each other, or the like are present in the image display device 200. In the dummy region 2, the row selection circuit, the column signal output circuit, the image processing circuit, and the input/output circuit other than the micro light element drive circuit are disposed on the drive circuit substrate 50.

The light emission element unit 101 is bonded to cover the pixel region 1. The micro light emission element 100 as shown in FIG. 1 is disposed in the light emission element unit 101 on the pixel region 1, but it is desirable to dispose a substrate-side dummy electrode 53 outside the pixel region 1 on the drive circuit substrate 50 and a dummy element 110 as a part of the light emission element unit 101 on the substrate-side dummy electrode 53. It is preferable that the dummy element 110 and the micro light emission element 100 are manufactured at same time on the growth substrate 9. Thus they have the same layered structure as shown in FIG. 4G and FIG. 5B and are formed of an identical material. These structures are for reducing leakage of the photo-curing resin 31 to the outside of the light emission element unit 101. For example, when the large amount of the photo-curing resin 31 leaks to the direction of (B) or (C) in a case where the photo-curing resin 31 is injected to a portion between the drive circuit substrate 50 and the light emission element unit 101 from the direction of (A) in FIG. 5A, the leaked resin covers the external connection region 3 and it is hard to remove the leaked resin. On the other hand, as in a direction of (D), some leakage to a portion where the external connection region 3 does not present does not matter. In addition, when the space between the drive circuit substrate 50 and the light emission element unit 101 is reduced, it takes more time for the photo-curing resin 31 to spread all over the space and the process time becomes longer, which are not desirable. Therefore, in an outer peripheral portion of the pixel region 1, it is desirable to adjust the size of the space depending on the directions. That is, in the dummy region 2, a space at a side adjacent to the external connection region 3 is provided to be small, and a space at a side far from the external connection region 3 is provided to be large.

In this configuration, the bonding surface of the light emission element unit 101 is flat, such that the size of the space is adjusted depending on the length of the substrate-side dummy electrode 53 on the drive circuit substrate 50 side. The substrate-side dummy electrode 53 may be increased in a case of making the space smaller as shown in FIG. 5B and the substrate-side dummy electrode 53 may be shortened in a case of making the space longer as shown in FIG. 5C. Here, the space is a portion which is filled with the photo-curing resin 31. As such, the leakage of the photo-curing resin 31 can be controlled to facilitate the electric connection in the external connection region 3 by disposing the substrate-side dummy electrode 53 for adjusting the size of the space and the dummy element 110 corresponding to the substrate-side dummy electrode 53 in the outer peripheral portion of the pixel region 1. That is, in this configuration, leakage of the photo-curing resin 31 from the pixel region 1 adjacent to the external connection region 3 can be smaller than leakage of the photo-curing resin 31 from the pixel region 1 far from the external connection region 3.

The dummy element 110 in an outer periphery of the light emission element unit 101 can be used as a temporal region when bonding the light emission element unit 101 onto the drive circuit substrate 50. It is not desirable to keep a state in which the light emission element unit 101 is pressed against the drive circuit substrate 50 while uniformly spreading the photo-curing resin 31 because the bonding throughput is decreased. For example, by performing light irradiation after injecting the photo-curing resin 31 from (B) side and (C) side and infiltrating the photo-curing resin 31 under the dummy element 110, the light emission element unit 101 is fixed to the drive circuit substrate 50 in the portion of the dummy element 110. The time desired for the photo-curing resin 31 to over the dummy element 110 is shorter than the time of infiltrating the whole light emission element unit, such that the bonding throughput can be improved. The photo-curing resin 31 is injected from (A) side after bonding a plurality of light emission element units 101 and is spread all over the light emission element unit 101, and then the light irradiation is performed. These steps can be performed concurrently to the plurality of light emission element units 101, high productivity can be realized even if it takes some time. Such a case, the space that is formed by the substrate-side dummy electrode 53 may be larger on (B) side and (C) side than the pixel region 1. When the photo-curing resin 31 is injected from (B) side and (C) side, since it is desirable to infiltrate a small amount of the photo-curing resin 31 into the dummy element 110 in a short time, it is desirable that the space is large. When the photo-curing resin 31 is injected from (A) side, the photo-curing resin 31 does not leak from (B) side and (C) side, because (B) side and (C) side have already been blocked by previously injected and cured photo-curing resin 31. On the other hand, in order to uniformize the infiltration of the photo-curing resin 31 on (D) side, for example, the space that is formed by the substrate-side dummy electrode 53 is reduced at the center portion of (D) side where infiltration speed is high, and the space can be gradually widen toward ends adjacent to (B) side and (C) side. That is, the dummy region 2 has a side in which a small space is provided at the center portion and a large space is provided at the periphery portion.

As such, it is desirable that the dummy element 110 is disposed at the outer periphery of the pixel region 1 in order to temporarily fix the light emission element unit 101, reduce the leakage of the photo-curing resin 31, uniformize the infiltration of the photo-curing resin 31, or the like. Furthermore, it is desirable to dispose the substrate-side dummy electrode 53 for controlling the space between the light emission element unit 101 and the drive circuit substrate 50 in the outer periphery of the pixel region 1. To temporarily fix the light emission element unit 101, it is preferable that the dummy elements on two sides facing to each other like (B) and (C) have larger space than the light emission element 100 in the pixel region. It is also preferable at least one of the sides is adjacent to the external connection region 3.

Modification Example of First Embodiment

In a first embodiment, the micro light emission element 100 is one type and is a monochromatic display device. However, as shown in. FIG. 6AA, a pixel 5 is formed of a blue sub-pixel 6, a red sub-pixel 7, and a green sub-pixel 8, so that a full color display device can be formed. Each sub-pixel has an individual micro light emission element. Each sub-pixel may be composed of a micro light emission element which emits blue light, red light, and green light, and the micro light emission element which emits the blue light may be combined with the wavelength conversion layer to emit the red light or the green light.

In FIG. 6AA, a periphery of each sub-pixel is surrounded by the isolation trench 15, the N-electrodes 19N are disposed all of on the isolation trench 15. However, as shown in FIG. 6AB, it is possible to dispose the N-electrode 19N so as to surround the pixel 5 while surrounding the periphery of each sub-pixel by the isolation trench 15. In such a case, it is not desirable to dispose the N-electrode 19N between the sub-pixels in the pixel 5, such that the isolation trench 15 between the sub-pixels can be narrowed. As a result, by widening a width of the mesa 16 of the sub-pixel, an area of the light emission layer 12 is widened, a density of current flowing in the light emission layer 12 is lowered, and thus the light emitting efficiency can be improved.

Furthermore, as shown in FIG. 6AC, the N-electrode 19N can be disposed in only one side of the boundary of the pixel 5 or, as shown in FIG. 6AD, the N-electrode 19N can be disposed at four corners of the pixel 5 in a dot shape. Both of FIGS. 6AC and 6AD have the same effect as FIG. 6AB, and the effect for improving light emitting efficiency becomes larger as an amount of the N-electrode 19N disposed is reduced. As such, the N-electrode 19N is disposed on the isolation trench 15 and it is not desirable to dispose the N-electrode 19N on the entire region of the isolation trench 15. Since it is desirable that the wiring resistance is uniform between the pixels 5 in order to make the variation in light output uniform between the pixels 5, it is desirable that the N-electrode 19N is at least provided for each pixel 5. Accordingly, as shown in FIG. 6AD, it is most desirable to dispose the N-electrode 19N at four corners of the pixel 5. A shape of the sub-pixel is not limited to a shape shown in FIG. 6AA, for example, a shape shown in FIG. 6BA may be used.

In the above examples, one P-electrode 19P is disposed for micro light emission element 100, but is not necessarily limited to one. For example, as shown in FIG. 6BB, two of a P-electrode 1 19P1 and a P-electrode 2 19P2 may be disposed. By providing the P-electrode 1 19P1 and the P-electrode 2 19P2, in a case where a conduction defect occurs on one of them, a redundant function of replacing the one to the other one can be realized. Here, the redundant function means that a spare device is disposed as a backup in a system, the backup device replaces a failure device which appears in the system, and the function of the entire system can be maintained.

In addition, as shown in FIG. 6BC, the micro light emission element 100 can be substantially divided in two by also dividing the P-electrode layer into a P-electrode layer 1 10-1 and a P-electrode layer 2 10-2. In a case where the P-electrode 1 19P1 side is defective, the redundant function can be realized not only for the conduction defect of the electrode but also for the micro light emission element 100 by using the P-electrode 2 19P2.

In order to realize the redundant function, it is required to cause each micro light emission element 100 on the drive circuit substrate 50 side to have a function of storing whether or not the defect occurs and selecting the normal P-electrode at the time of operation. Although it increases costs, cost reduction effect due to yield improvement by redundancy becomes larger in general, and thus such a redundant function is effective.

In this case, the pattern of the P-electrode layer 10 and the pattern of the mesa 16 are different from each other, so that the photolithography process may increase by one step. However, it can be determined which way to choose, to have only two P-electrodes or to split both P-electrode layer and P-electrode, by considering trade-off between the increase in cost due to process increase and the cost reduction due to the yield improvement by the redundant function. As such, the P-electrode is disposed on the mesa. 16 having the light emission layer 12, but is not necessarily limited to one, and a plurality the P-electrodes may be disposed.

To dispose the electrode in the micro light emission element 100 in a small and dense manner is desirable from various aspects, such as not only the minimization of the pixel but also a formation of the sub-pixel for colorization and an addition of redundant function for yield improvement, as described above. It is becoming more and more difficult to form a bump on each electrode in response to such the miniaturization in size of the electrode. As in the present disclosure, in the structure for disposing the self-organized metal nanoparticles, a number of projecting portions can be provided on the respective electrodes without concerning a short circuit between the electrodes.

Second Embodiment

Another embodiment of the present disclosure will be described below.

As shown in FIG. 7A, an image display device 200a of the present disclosure is different from the image display device 200 of the first embodiment in that, the bonding surface on a drive circuit substrate 50a side is flat, the bonding surface side of the micro light emission element 100a is not flat, the micro light emission elements 100a are separated individually, the micro light emission element 100a has the P-electrode 19P on the bonding surface side, and the common N-electrode 40 is provided on the light emission surface side.

Outline of Image Display Device 200a

As shown in. FIG. 7A, the image display device 200a has a configuration in which the micro light emission element 100a which emits light is bonded to the drive circuit substrate 50a. at the bonding surface (indicated by thick broken line). The micro light emission element 100a has the light emission layer 12 isolated by the isolation trench 15 and, the micro light emission elements 100a are separated individually by the separation trench 20. In the pixel region 1, the P-electrode 19P (second electrode) connected to the P-side layer 13 is disposed in the region in which the light emission layer 12 remains. In addition, as shown in FIG. 7B, the common N-electrode 40 connected to the N-side layer 11 is connected to the N-electrode 19N (first electrode) outside the pixel region 1.

A surface of the P-drive electrode 51 on a drive circuit substrate 50a side is configured to be almost flush with a surface of the insulating layer 55. The P-electrode 19P is connected to the P-drive electrode 51 on the drive circuit substrate 50a side.

Nanometer-sized metal nanoparticles 30 are arranged at the boundary surface between the P-electrode 19P and the P-drive electrode 51. A portion between the drive circuit substrate 50a and the micro light emission element 100a is filled with the photo-curing resin 31. Since the P-electrode 19P and the P-drive electrode 51, or the N-electrode 19N and the N-drive electrode 52 are in contact with each other via a number of metal nanoparticles 30 and the drive circuit substrate 50a and the micro light emission element 100a are firmly in close contact with each other due to the shrinkage of the photo-curing resin 31, excellent electrical connection can be realized.

In this configuration, the bonding surface of the drive circuit substrate 50a is flat, such that the size of the space 33 is determined by the P-electrode 19P, an exposed portion of the protection layer 17 disposed in a part of the isolation trench 15, and the separation trench 20. That is, the P-electrode 19P is a protrusion portion and both the exposed portion of the protection layer 17 and the separation trench 20 are the recess portion of the surface on the bonding surface side of the micro light emission element 100a. The recess potion overlaps the isolation trench 15. Specially, the size of the space 33 is adjusted depending on the length of the P-electrode 19P on a light emission element unit 101a side and the width of the separation trench 20. As shown in FIG. 7C, in a case where the space 33 is reduced, the P-electrode 19P in a dummy element 110a may be elongated so as to reduce the disposition of a separation trench 20. On the contrary, the separation trench 20 may be disposed densely so as to shorten the P-electrode 19P in a case where the space 33 becomes large. That is, the length of the part of the isolation trench 15 may be longer. As in the first embodiment, the dummy element 110a can be used for temporarily fixing the light emission element unit 101a by disposing the dummy element 110a on an outer periphery portion of the pixel region 1. In addition, as in the first embodiment, the leakage of the photo-curing resin 31 can be reduced or the infiltration of the photo-curing resin 31 can be uniformized by controlling a width of the space 33 of the dummy element 110a.

Manufacturing Method of Micro Light Emission Element 100a

Next, a manufacturing step of the micro light emission element 100a will be described with reference to FIGS. 8A to 8E. The figure shows the pixel region 1 on the left side and a portion of the dummy element 110a including the N-electrode on the right side. As can been seen in FIG. 8A to 8E, the dummy element 110a and the micro light emission element 100a are manufactured at same time on the growth substrate 9. Thus they have the same layered structure and are formed of an identical material. The manufacturing step of the micro light emission element 100a is made through the same step in FIGS. 3A to 3C, and thus will be omitted. Accordingly, the protection layer 17 is deposited on the mesa 16 as shown in FIG. 8A, and then, the P-groove 18P is formed on the mesa 16 as shown in FIG. 8E. The P-groove 18P has a hole shape and reaches the P-electrode layer 10. The N-groove 18N is formed on the bottom portion of the isolation trench 15 and reaches the N-side layer 11 in a dummy element region. As shown in FIG. 8C, the P-groove 18P and the N-groove 18N are buried with the metal film and the P-electrode 19P and the N-electrode 19N are formed, by the damascene method.

Next, as shown in FIG. 8D, an upper portion of the P-electrode 19P and the N-electrode 19N is exposed by etching the surface of the protection layer 17. This etching may be dry etching or wet etching. Furthermore, as shown in FIG. 8E, the protection layer 17 and the compound semiconductor 14 are etched to form the separation trench 20. The separation trench 20 desirably separates the micro light emission element 100a individually. Since light leakage between the micro light emission elements 100a is reduced by separating the micro light emission element 100a, contrast of a display image can be improved and color mixture can be reduced.

As in the micro light emission element 100a, the light emission element which has only one electrode on the bonding surface needs additional process steps to form the other electrode on the light emission surface after bonding to the drive circuit substrate 50a However, the micro light emission element 100a is beneficial in that the pixel can be formed to such a fine pixel size that there is no space for disposing the P-electrode and the N-electrode in parallel on the bonding surface.

As shown in. FIG. 8E, it is desirable that the separation trench 20 reaches the growth substrate 9, however, the compound semiconductor 14 may remain. As a film thickness of remained compound semiconductor 14 becomes thinner, the light leakage is reduced and thus, from the viewpoint of reduction of the light leakage, it is desirable that the film thickness of remained compound semiconductor 14 is as thin as possible. However, remaining the thin compound semiconductor 14 is beneficial in that the resistance of the common N-electrode 40 and the diffusion of exit light cap be reduced since the light emission surface of the micro light emission element 100a can be uniform and flat.

Manufacturing Method of Image Display Device 200a

Figure 9A:
FIGS. 9A to 9H are views showing a manufacturing step of the image display device according to the second embodiment of the present disclosure.
Figure 9B:
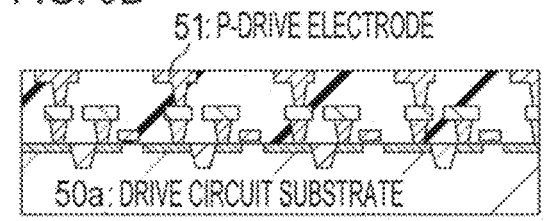

Next, a manufacturing step of the image display device 200a will be described with reference to FIGS. 9A to 9H. As shown in FIG. 9A, the micro light emission element 100a is formed through the steps in FIGS. 8A to 8E. Next, the drive circuit substrate 50a is manufactured as shown in FIG. 9B. The drive circuit substrate 50a is formed on a single crystal silicon substrate (wafer) by the ordinary complementary metal-oxide semiconductor (CMOS) process. The surface of the P-drive electrode 51 and the surface of the N-drive electrode 52 on the drive circuit substrate 50a side is configured to be flush with the surface of the insulating layer 55. The wiring material forming the P-drive electrode 51 and the N-drive electrode 52 is, for example, copper wiring. In a case of the copper wiring, the copper wiring is formed by the damascene method, such that the surface is flat and the structure in FIG. 9B can be easily manufactured.

Figure 9C:
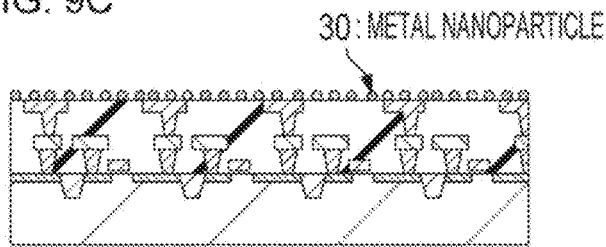
Figure 9D:
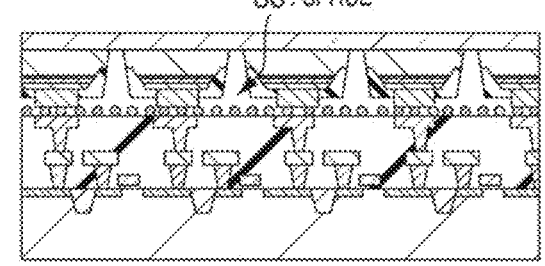

Next, as shown in FIG. 9C, the nanoparticles of palladium are arranged on the surface of the drive circuit substrate 50a by the method as in the first embodiment. In the first embodiment, the metal nanoparticles 30 are arranged on the bonding surface of the micro light emission element 100 as shown in FIG. 4B, but in the present embodiment, the metal nanoparticles 30 are arranged on the bonding surface of the drive circuit substrate 50a.

Here, it is desirable that the drive circuit substrate 50a is in a wafer state and it is desirable that the micro light emission elements 100a and their growth substrate 9 in FIG. 9A is a group divided from a wafer for example, where each group corresponds to an image display device 200a. The divided group of the micro light emission element 100a is referred to as a light emission element unit 101a.

Figure 9E:
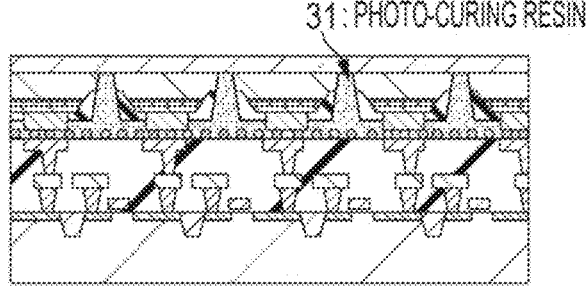

Next, the light emission element unit 101a is disposed on the silicon surface on which the drive circuit substrate 50a is formed as shown in FIG. 3D, and the photo-curing resin 31 is injected to the boundary surface as shown in FIG. 9E. By performing connection in unit of the light emission element, the time in which the photo-curing resin 31 is spread all over the space can be shortened and therefore the bonding time is also reduced. It is also possible to bond the wafers together by taking more time.

Figure 9F:
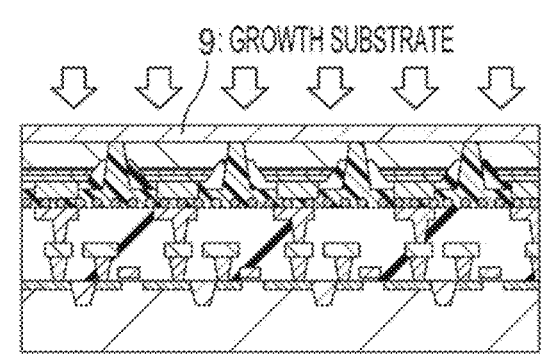
Figure 9G:
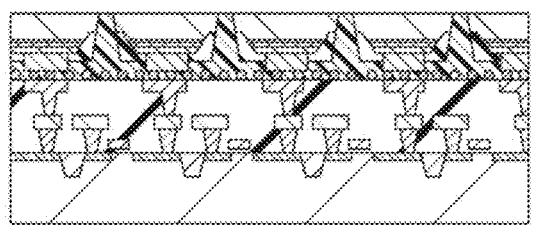

Next, as shown in FIG. 9F, light for curing resin is radiated from the growth substrate 9 side to cure the resin, such that the photo-curing resin 31 is cured. In a case where the growth substrate 9 does not transmit light like a silicon substrate, since photo curing is not able to be performed unless the growth substrate 9 is peeled off, it is desirable that the growth substrate 9 can transmit light to cure the photo-curing resin 31. By performing the photo curing, the drive circuit substrate 50a and the micro light emission element 100a are firmly connected to each other, and thus it is easy to perform a subsequent peeling step of the growth substrate (FIG. 9G). The peeling of the growth substrate 9 can be realized by the laser lift-off method or the like. By performing heating after peeling the growth substrate 9, the polymerization of the photo-curing resin 31 is further promoted so as to make electrical connection firmer. At this time, since the growth substrate 9 is peeled off, the thermal stress caused by the difference in coefficient of thermal expansion is greatly released.

Figure 9H:
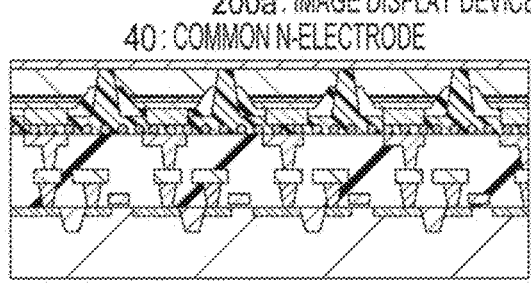

Next, as shown in FIG. 9H, the common N-electrode 40 is formed on the light emission surface side of the micro light emission element 100a. The common N-electrode 40 is indium-tin-oxide (ITO) thin film which is a transparent conductive film.

In this configuration, the effect same as the first embodiment can be obtained.

Third Embodiment

Still another embodiment of the present disclosure will be described below.

As shown in. FIG. 10A, in an image display device 200b of the present embodiment, both the bonding surface on a drive circuit substrate 50b side and the bonding surface on a micro light emission element 100b side are not flat and the micro light emission elements 100b are separated individually, which are different from the image display device 200 of the first embodiment.

Outline of Image Display Device 200b

As shown in FIG. 10A, the image display device 200b has a configuration in which the micro light emission element 100b which emits light is bonded to the bonding surface (indicated by thick broken line) on the drive circuit substrate 50b. The micro light emission element 100b has the light emission layer 12 isolated by an isolation trench 15 and, the micro light emission elements 100b are separated individually by the separation trench 20.

Since the P-electrode 19P and the N-electrode 19N are simultaneously formed by the same step as described later, although shapes, sizes, and depths are different from each other, as a material, the P-electrode 19P and the N-electrode 19N are constituted by the wiring materials having the same structure. Generally, the wiring material has a laminated structure formed of a plurality of layers such as a barrier metal layer, a main conductive layer, and a cap layer, but the P-electrode 19P and the N-electrode 19N have the same laminated structure. That is, the image display device 200b is constituted by a single wiring layer on the micro light emission element 100b side.

In the configuration of the present embodiment, since the P-electrode 19P and the N-electrode 19N is formed of a metal material ohmic-connected to the N-side layer 11, the ohmic connection to the P-side layer 13 is performed via the P-electrode layer 10. In a case where the compound semiconductor 14 is a nitride semiconductor, the P-electrode layer 10 is a good conductor, for example, an indium-tin-oxide (ITO) which is a transparent electrode, palladium (Pd), or the like.

The isolation trench 15 of the micro light emission element 100b is covered by a protection layer 17b, but is not buried. The P-electrode 19P and the N-electrode 19N are formed on the bonding surface side and the P-electrode 19P (second electrode) connected to the P-side layer 13 and the N-electrode 19N connected to the N-side layer 11 are disposed in the region in which the light emission layer 12 of the micro light emission element 100b remains.

The surface of the P-drive electrode 51 and the surface of the N-drive electrode 52 on the drive circuit substrate 50b side are configured to be higher than the surface of the insulating layer 55. The P-electrode 19P and the N-electrode 19N are respectively connected to the P-drive electrode 51 and the N-drive electrode 52 on the drive circuit substrate 50b side.

Nanometer-sized metal nanoparticles 30 are arranged at the boundary surface of both electrodes. A portion between the drive circuit substrate 50b and the micro light emission element 100b is filled with the photo-curing resin 31. Since the P-electrode 19P and the P-drive electrode 51, or the N-electrode 19N and the N-drive electrode 52 are in contact with each other via a number of metal nanoparticles 30 and the drive circuit substrate 50b and the micro light emission element 100b are firmly in close contact with each other due to the shrinkage of the photo-curing resin 31, excellent electrical connection can be realized.

As such, the P-electrode 19P and the P-drive electrode 51, or the N-electrode 19N and the N-drive electrode 52 are electrically connected by the metal nanoparticles 30, such that surface layers of the P-electrode 19P and the N-electrode 19N and surface layers of the P-drive electrode 51 and the N-drive electrode 52 may have different materials.

In this configuration, since the electrode of the bonding surface of the drive circuit substrate 50b is formed to be higher than the insulating layer 55, the substrate-side dummy electrode 53 is disposed outside the pixel region. 1 and thus the size of the space can be controlled. That is, a protrusion portion of the surface on the bonding surface side of the drive circuit substrate 50b is an electrode of the P-drive electrode 51, the N-drive electrode 52, the dummy electrode 53, or the like, and the recess portion is the exposed portion of the insulating layer 55. In addition, the size of the space can be adjusted depending on the length of the P-electrode 19P at the light emission element unit 101b side and the width of the separation trench 20. That is, the protrusion portion of the surface on the bonding surface side of the light emission element unit 101b side is an electrode of the P-electrode 19P or the N-electrode 19N, and the recess portion is the isolation trench 15 including the separation trench 20. As shown in FIG. 10B, in a case where the space is reduced, the P-electrode 19P in a dummy element 110b may be elongated so as to reduce the disposition of the separation trench 20. In parallel, the long substrate-side dummy electrode 53 may be disposed. On the contrary, the separation trench 20 may be disposed densely so as to shorten the P-electrode 19P in a case where the space becomes large. The short substrate-side dummy electrode 53 may be disposed. As in the first embodiment, the dummy element 110b can be used for temporarily fixing the light emission element unit 101b by disposing the dummy element 110b on an outer periphery portion of the pixel region 1. In addition, as in the first embodiment, the leakage of the photo-curing resin 31 can be reduced or the infiltration of the photo-curing resin 31 can be uniformized by controlling a width of the space of the dummy element 110b.

Manufacturing Method of Micro Light Emission Element 100b

Figure 11A:
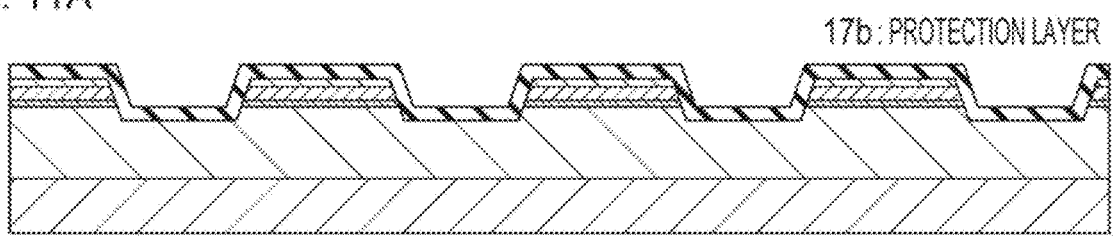
FIGS. 11A to 11D are views showing a manufacturing step of a micro light emission element according to the third embodiment of the present disclosure.
Figure 11B:
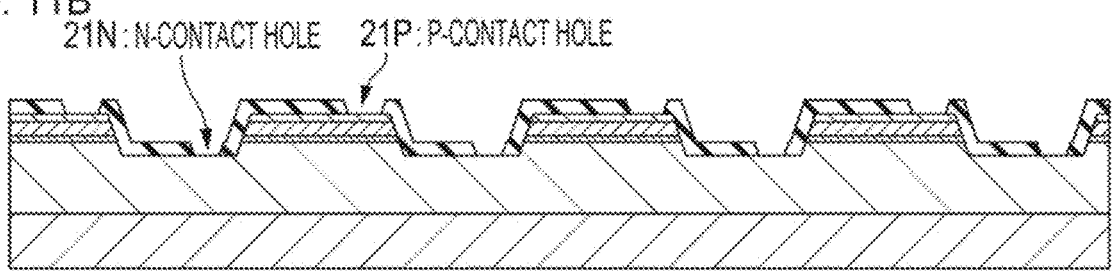
Figure 11C:
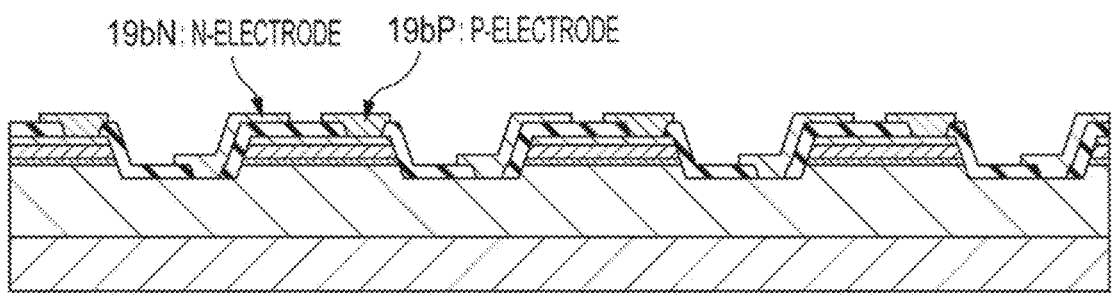

Next, a manufacturing step of the micro light emission element 100b will be described with reference to FIGS. 11A to 11D. The manufacturing step of the micro light emission element 100b is made through the same steps in FIG. 3A and FIG. 3B, and thus will be omitted. As shown in FIG. 11A, the protection layer 17b is deposited, but it is not desirable that the isolation trench 15 is completely buried unlike the first embodiment, and thus a thin film is sufficient. Next, as shown in FIG. 11B, a P-contact hole 21P is formed on the mesa 16 and an N-contact hole 21N is formed on the bottom portion of the isolation trench 15. The P-contact hole 21P has a hole shape and reaches the P-electrode layer 10, and the N-contact hole 21N also has a hole shape and reaches the N-side layer 11. As shown in FIG. 11C, the P-electrode 19bP and an N-electrode 19bN are formed by the lift-off method. As an electrode material, for example, gold (Au) is used as a main conductive layer, and nickel (Ni) and platinum (Pt) serving as an adhesive layer or a barrier layer are disposed at lower portion thereof.

Figure 11D:
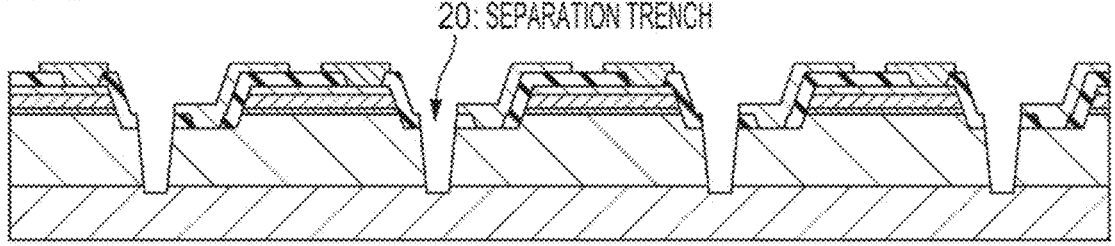

Next, as shown in FIG. 11D, the separation trench 20 is formed by etching the protection layer 17b of the isolation trench 15 and the compound semiconductor 14. It is desirable that the separation trench 20 separates the micro light emission element 100b individually. The role of the separation trench 20 is the same as in the second embodiment.

Figure 12A:
FIGS. 12A to 12H are views showing a manufacturing step of the image display device according to the third embodiment of the present disclosure.

The manufacturing step is similar to a manufacturing step of the LED in the related art and is simple and is effective in a case where the micro light emission element 100b is relatively large. Manufacturing Method of Image Display Device 200b Next, a manufacturing step of the image display device 200b will be described with reference to FIGS. 12A to 12H. The drive circuit substrate 50b is manufactured as shown in FIG. 12A. The drive circuit substrate 50b is formed on a single crystal silicon substrate (wafer) by the ordinary complementary metal-oxide semiconductor (CMOS) process. The surface of the P-drive electrode 51 and the surface of the N-drive electrode 52 on the drive circuit substrate 50b side are configured to be higher than the surface of the insulating layer 55. The wiring material forming the P-drive electrode 51 and the N-drive electrode 52 is, for example, aluminum alloy wiring.

Since it is not easy to form the metal nanoparticles as it is on the surface of the substrate with such protrusion portions and recess portions, it is desirable to flatten the surface first, form the metal nanoparticle, and then remove the remaining portion other than the electrode portion.

Figure 12B:
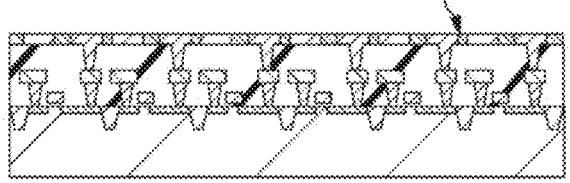
Figure 12C:
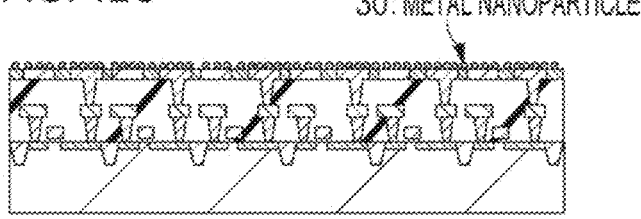
Figure 12D:
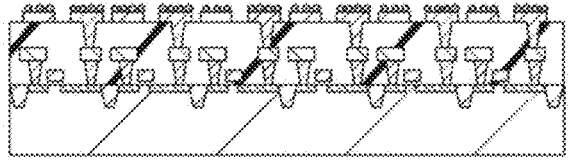

First, as shown in FIG. 12B, the flattening layer 32 is formed between the P-drive electrode 51 and the N-drive electrode 52 first. Next, as shown in FIG. 12C, the nanoparticles of palladium are arranged by the method as in the first embodiment. After that, as shown in FIG. 12C, the flattening layer 32 is removed. The flattening layer 32 is, for example, a resin layer, and can be coated, flattened by etch-back, and dissolved and removed by the solvent.

Figure 12H:
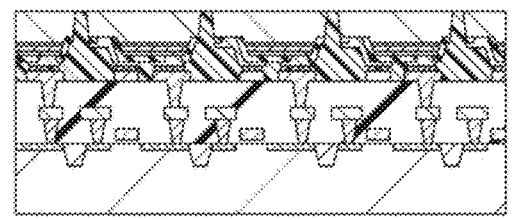
Figure 12E:
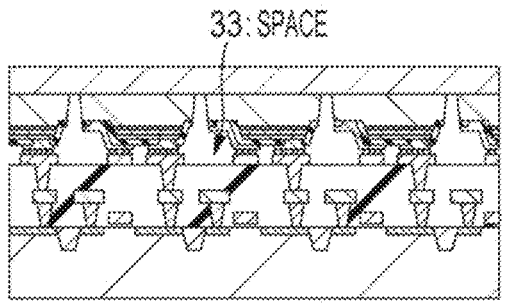

Here, it is desirable that the drive circuit substrate 50b is in a wafer state and it is desirable that the micro light emission elements 100b and their growth substrate 9 in FIG. 12E is a group divided from a wafer for example, where each group corresponds to an image display device 200b. The divided group of the micro light emission element 100b is referred to as a light emission element unit 101b.

Figure 12F:
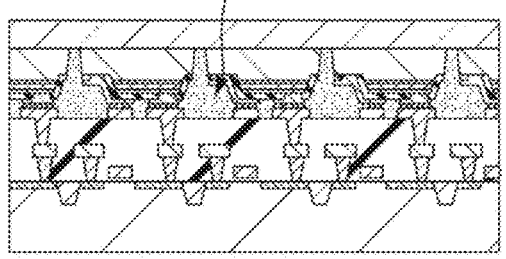

Next, as shown in. FIG. 12E, the light emission element unit 101b is disposed on the silicon surface on which the drive circuit substrate 50b and, as shown in FIG. 12F, the photo-curing resin. 31 is injected.

Figure 12G:
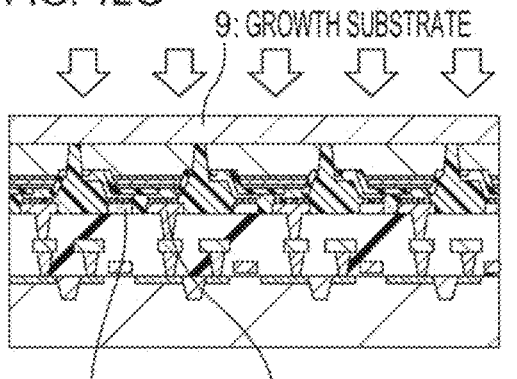

Next, as shown in FIG. 12G, light is radiated from the growth substrate 9 side to cure the resin, such that the photo-curing resin 31 is cured. In a case where the growth substrate 9 does not transmit light as a silicon substrate, since photo curing is not able to be performed unless the growth substrate 9 is peeled off, it is desirable that the growth substrate 9 can transmit the curing light. By performing the photo curing, the drive circuit substrate 50b and the micro light emission element 100b are firmly connected to each other, and thus it is easy to perform a subsequent peeling step of the growth substrate (FIG. 12H). The peeling of the growth substrate 9 can be realized by the laser lift-off method or the like. By performing heating after peeling the growth substrate 9, the polymerization of the photo-curing resin 31 is further promoted so as to make electrical connection firmer. At this time, since the growth substrate 9 is peeled off, the thermal stress caused by the difference in coefficient of thermal expansion is greatly released.

In this configuration, the same effect as the first embodiment can be obtained.

Fourth Embodiment

Still another embodiment of the present disclosure will be described below.

As shown in FIG. 13E, the present embodiment is different from the micro light emission element 100 of the first embodiment in that a micro light emission element 100c is vertical cavity surface emitting laser (VOSEL) type micro laser element. As compared with the micro LED element, the spectrum of an emission wavelength is narrowed and display with high directivity is possible.

Manufacturing Method of Micro Light Emission Element 100c

An example of a manufacturing method of the micro light emission element 100c will be described with reference to FIGS. 13A to 13E. FIGS. 13A to 13E are sectional views each showing a manufacturing step of the micro light emission element 100c.

As shown in FIG. 13A, a first reflection layer 42, an N-side layer 11c, the light emission layer 12, and the P-side layer 13 are deposited on the growth substrate 9 in this order to form a compound semiconductor 14c. The first reflection layer 42 is a distributed Bragg reflector (DBR) which reflects light of an oscillated wavelength and may be a part of the N-side layer 11c. The first reflection layer 42 can be formed by stacking a plurality of pairs of an AlxGa(1−x)N layer and a GaN layer in a case where the blue light is emitted using the nitride semiconductor. For example, the first reflection layer 42 includes 20 layers of GaN/AlGaN pair in which a thickness of GaN layer is 46 nm, a thickness of the AlxGa(1−x)N layer is 47 nm, and a total thickness of GaN/AlGaN pair is 93 nm, and a total thickness of the first reflection layer 42 is about 1.8 μm.

A transparent electrode layer 44 and a second reflection layer 45 are further deposited on the compound semiconductor 14c. The transparent electrode layer 44 is an electrode layer such as indium-tin-oxide (ITO), and a thickness thereof is about 50 nm to 600 nm. The second reflection layer 45 is DBR formed of a dielectric multilayer film. For example, the second reflection layer 45 includes 10 layers of a pair of a TiO$_2$ thin film (thickness of 36 nm) and a SiO$_2$ thin film (thickness of 77 nm), and an entire thickness thereof is about 1.1 μm. A reflectance of the second reflection layer to the blue light is higher than a reflectance of the first reflection layer 42.

As shown in FIG. 13B, after the second reflection layer 45 is laminated, the isolation trench 15 is formed by a photolithography technique and a dry etching technique. The isolation trench 15 is formed by etching a portion of the second reflection layer 45, a transparent electrode 44, the P-side layer 13, the light emission layer 12, and a part of the N-side layer 11c. It is not desirable that a side surface of the isolation trench 15 is greatly inclined unlike the first embodiment. This is because a laser element does not emit light in a horizontal direction, it is not necessary to have reflection surface of the horizontally emitted light. Next, as shown in FIG. 13C, the isolation trench 15 is buried with the protection layer 17 and the surface is flattened. In addition, as shown in FIG. 13D, the N-groove 18N and the P-groove 18P are formed. The N-groove 18N reaches the N-side layer 11c of the bottom portion of the isolation trench 15 by etching the protection layer 17. The P-groove 18P reaches the transparent electrode 44 by etching the protection layer 17 and the second reflection layer 45. Next, as shown in FIG. 13E, a P-electrode 19cP and the N-electrode 19N are formed. Here, the P-electrode 19cP is formed above the light emission layer 12, but it is desirable that the P-electrode 19cP is not disposed on the center in the region where the light emission layer 12 is present, and is disposed on the outer peripheral portion. This is because the P-electrode 19cP penetrates the second reflection layer 45, resulting in inhibition of the light emission by the laser element.

By doing so, the P-electrode 19cP is disposed above the light emission layer 12 and the N-electrode 19N is disposed on the isolation trench 15, the P-electrode 19cP and the N-electrode 19N are disposed together on the surface which is to be the bonding surface, the surfaces thereof are configured to be made of the same materials and are leveled with the surface of the protection layer 17. The image display device which is the same as the first embodiment can be configured by bonding the micro light emission element 100c to the drive circuit substrate (the same as the drive circuit substrate 50 in the first embodiment). The same effect as the first embodiment can be realized. Furthermore, the present embodiment can achieve an additional effect in that a width of the spectrum of the emission wavelength is narrowed and thus directivity becomes high with respect to the first embodiment.

The present disclosure is not limited to the embodiments described above, and various modifications are possible within the scope of claims. The embodiments obtained by combining the technical means disclosed in different embodiments are included in the technical scope of the present disclosure. Further, by combining the technical means disclosed in each embodiment, new technical features can be formed.

The present disclosure contains subject matter related to that disclosed in Japanese Priority Patent Application No. 62-678533 filed in the Japan Patent Office on May 31, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising: a plurality of micro light emission elements that are connected onto a drive circuit substrate incorporating a drive circuit of the micro light emission element,
    wherein the micro light emission element has a light emission surface on an opposite side to a bonding surface with the drive circuit,
    at least one of a surface on a connecting surface side of the micro light emission element and a surface on a connecting surface side of the drive circuit substrate has a protrusion portion and a recess portion,
    an electrode of the micro light emission element and an electrode on a side of the drive circuit substrate are connected to each other via a metal nanoparticle, and
    a space formed between the surface on the connecting surface side of the micro light emission element and the surface on the connecting surface side of the drive circuit substrate is filled with a photo-curing resin.

2. The image display device according to claim 1, wherein the surface on the connecting surface side of the micro light emission element is flat, and the surface on the connecting surface side of the drive circuit substrate has the protrusion portion and recess portion.

3. The image display device according to claim 2, wherein a protrusion portion of the surface on the connecting surface side of the drive circuit substrate is an electrode.

4. The image display device according to claim 1, wherein the surface on the connecting surface side of the drive circuit substrate is flat, and the surface on the connecting surface side of the micro light emission element has the protrusion portion and recess portion.

5. The image display device according to claim, 4, wherein a protrusion portion of the surface on the connecting surface side of the micro light emission element is an electrode.

6. The image display device according to claim 4, wherein a recess portion of the surface on the connecting surface side of the micro light emission element is an isolation trench part which isolates a light emission layer in the micro light emission element.

7. The image display device according to claim 1, wherein the surface on the connecting surface side of the micro light emission element has the protrusion portion and recess portion, and the surface on the connecting surface side of the drive circuit substrate has the protrusion portion and recess portion as well.

8. The image display device according to claim 7, wherein a protrusion portion of the surface on the connecting surface side of the micro light emission element is an electrode, the recess portion is an isolation trench part which isolates the light emission layer of the micro light emission element, and a protrusion portion if the surface on the connecting surface side of the drive circuit substrate is an electrode.

9. The image display device according to claim 1, wherein the metal nanoparticle is disposed on the surface on the connecting surface side of the micro light emission element.

10. The image display device according to claim 1, wherein the metal nanoparticle is disposed on the surface on the connecting surface side of the drive circuit substrate.

11. The image display device according to claim 1,
wherein an outer periphery of a pixel region formed of a pixel which emits light in the image display device has a dummy region in which a dummy element formed of an identical material as that of the micro light emission element and a dummy electrode corresponding to the dummy element are disposed on the drive circuit substrate, and a space between the dummy element and the drive circuit substrate differs from the pixel region.

12. The image display device according to claim 11,
wherein both a dummy electrode that the dummy element has and a dummy electrode on the side of the drive circuit substrate are longer than a pixel portion.

13. The image display device according to claim 11,
wherein a length of the isolation trench part that the dummy element has is longer than that of a pixel portion.

14. The image display device according to claim 11,
wherein a pattern of the space between the dummy element and the drive circuit substrate differs depending on a side of the pixel region.

15. The image display device according to claim 11,
wherein in the dummy region, a space at a side adjacent to an external connection region of the image display device is provided to be small, and a space at a side far from the external connection region is provided to be large.

16. The image display device according to claim 11,
wherein a center portion at a side of the dummy region has a small space, and a periphery portion has a large space.

17. The image display device according to claim 11,
wherein two sides of the dummy region facing to each other have the space larger than the space in the pixel region.

18. The image display device according to claim 17,
wherein one of the two sides of the dummy region is adjacent to an external connection region of the image display device.

19. The image display device according to claim 1,
wherein leakage of the photo curing resin at a side adjacent to an external connection region of the image display device is smaller than leakage of the photo-curing resin at a side far from the external connection region.

* * * * *